United States Patent
Pirola et al.

(10) Patent No.: US 9,325,541 B2
(45) Date of Patent: Apr. 26, 2016

(54) MODULAR FREQUENCY DIVIDER WITH SWITCH CONFIGURATION TO REDUCE PARASITIC CAPACITANCE

(71) Applicant: Marvell World Trade LTD., St. Michael (BB)

(72) Inventors: Alberto Pirola, Pavia (IT); Danilo Gerna, Fino Mornasco (IT)

(73) Assignee: Marvell World Trade LTD., St. Michael (BB)

( * ) Notice: Subject to any disclaimer, the term of this patent is extended or adjusted under 35 U.S.C. 154(b) by 19 days.

(21) Appl. No.: 14/279,780

(22) Filed: May 16, 2014

(65) Prior Publication Data

US 2014/0247903 A1    Sep. 4, 2014

Related U.S. Application Data

(63) Continuation-in-part of application No. 13/892,818, filed on May 13, 2013, now Pat. No. 8,965,310, which is a continuation of application No. 13/194,089, filed on Jul. 29, 2011, now Pat. No. 8,442,562.

(Continued)

(51) Int. Cl.
*H04B 1/04* (2006.01)
*H04L 25/08* (2006.01)
*H04L 25/03* (2006.01)
(Continued)

(52) U.S. Cl.
CPC .............. *H04L 25/08* (2013.01); *H03B 19/00* (2013.01); *H03K 21/10* (2013.01); *H03K 23/667* (2013.01); *H04L 25/03828* (2013.01); *H04W 52/367* (2013.01)

(58) Field of Classification Search
CPC ....................................... H04L 25/08
USPC .................................. 455/118, 112
See application file for complete search history.

(56) References Cited

U.S. PATENT DOCUMENTS 5,194,906 A    3/1993    Kimura et al.
6,118,314 A    9/2000    Arnould et al.
(Continued)

FOREIGN PATENT DOCUMENTS

CN    101483429    7/2009
EP    1 460 767 A1    9/2004

OTHER PUBLICATIONS

Invitation to Pay Addition Fees and Communication Relating to the Results of the Partial International Search for Application No. PCT/IOB2014/061605 dated Oct. 27, 2014; 6 Pages.

(Continued)

*Primary Examiner* — Sanh Phu

(57) ABSTRACT

A system comprising a first frequency divider to divide an input frequency of an input signal to generate a first signal having a first frequency and a first phase. Each of a plurality of second frequency dividers divides the input frequency of the input signal to generate a second signal having the first frequency and a second phase. A first switch includes a first end connected to a first node of the first frequency divider, and a second end connected to a second node of a first one of the plurality of second frequency dividers. A plurality of second switches include first ends connected to the second end of the first switch, and second ends respectively connected to the second nodes of the plurality of second frequency dividers other than the first one of the plurality of second frequency dividers.

20 Claims, 16 Drawing Sheets

Related U.S. Application Data

(60) Provisional application No. 61/480,335, filed on Apr. 28, 2011, provisional application No. 61/368,935, filed on Jul. 29, 2010, provisional application No. 61/826,235, filed on May 22, 2013.

(51) Int. Cl.
*H03B 19/00* (2006.01)
*H03K 23/66* (2006.01)
*H03K 21/10* (2006.01)
*H04W 52/36* (2009.01)

(56) References Cited

U.S. PATENT DOCUMENTS

| | | |
|---|---|---|
| 7,109,803 B2 | 9/2006 | Rebel |
| 7,409,192 B2 | 8/2008 | Lombardi et al. |
| 7,622,996 B2 | 11/2009 | Liu |
| 8,188,776 B2 | 5/2012 | Kumagai |
| 8,339,175 B2 | 12/2012 | Liu et al. |
| 8,847,638 B2 * | 9/2014 | Chan et al. ............ 327/118 |
| 2006/0025095 A1 | 2/2006 | Rafi |
| 2009/0091361 A1 | 4/2009 | Korpi et al. |
| 2009/0267657 A1* | 10/2009 | Sun et al. ............ 327/141 |
| 2011/0012648 A1 | 1/2011 | Qiao et al. |
| 2012/0027121 A1 | 2/2012 | Gerna et al. |

OTHER PUBLICATIONS

Chinese Office Action dated Sep. 22, 2014 for Chinese Application No. 201180043792.5; 6 Pages.

The International Search Report and Written Opinion of the International Searching Authority dated Dec. 20, 2011, for corresponding International Application No. PCT/IB2011/001760, 15 pages.

The International Search Report of the International Searching Authority dated Jan. 13, 2015, for corresponding International Application No. PCT/IB2014/061605, 7 pages.

The Written Opinion of the International Searching Authority dated Jan. 13, 2015, for corresponding International Application No. PCT/IB2014/061605, 7 pages.

* cited by examiner

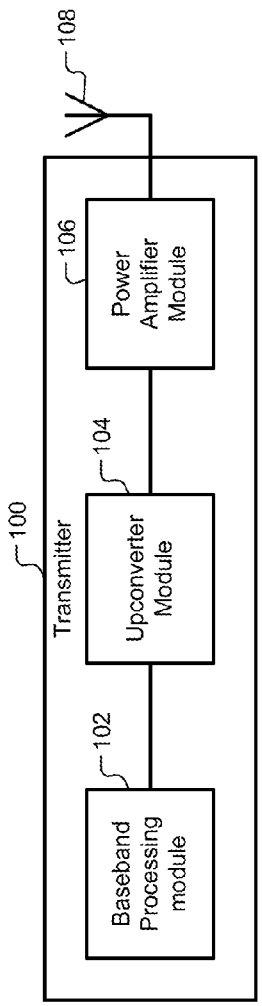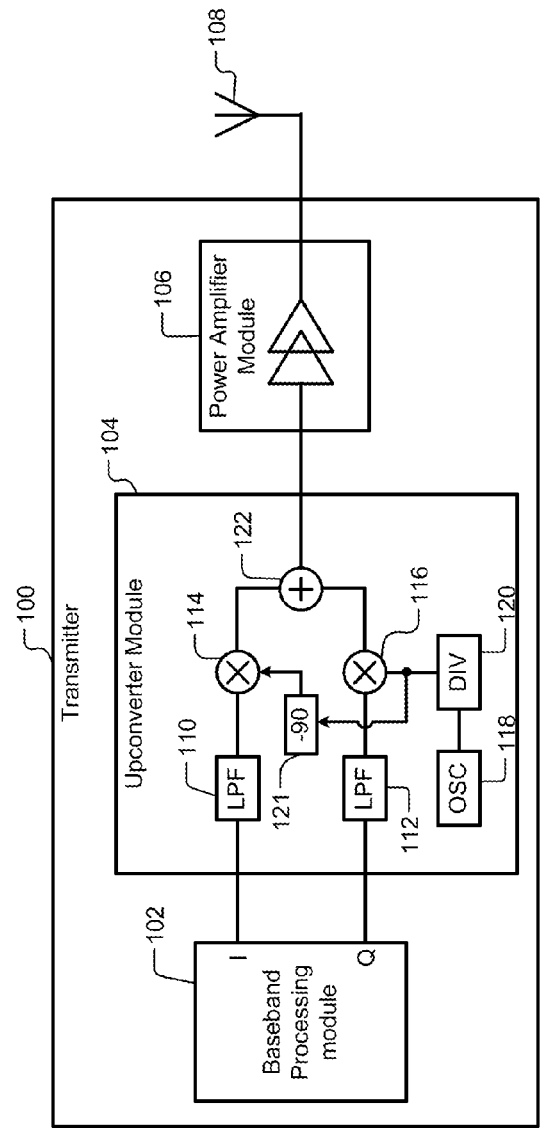

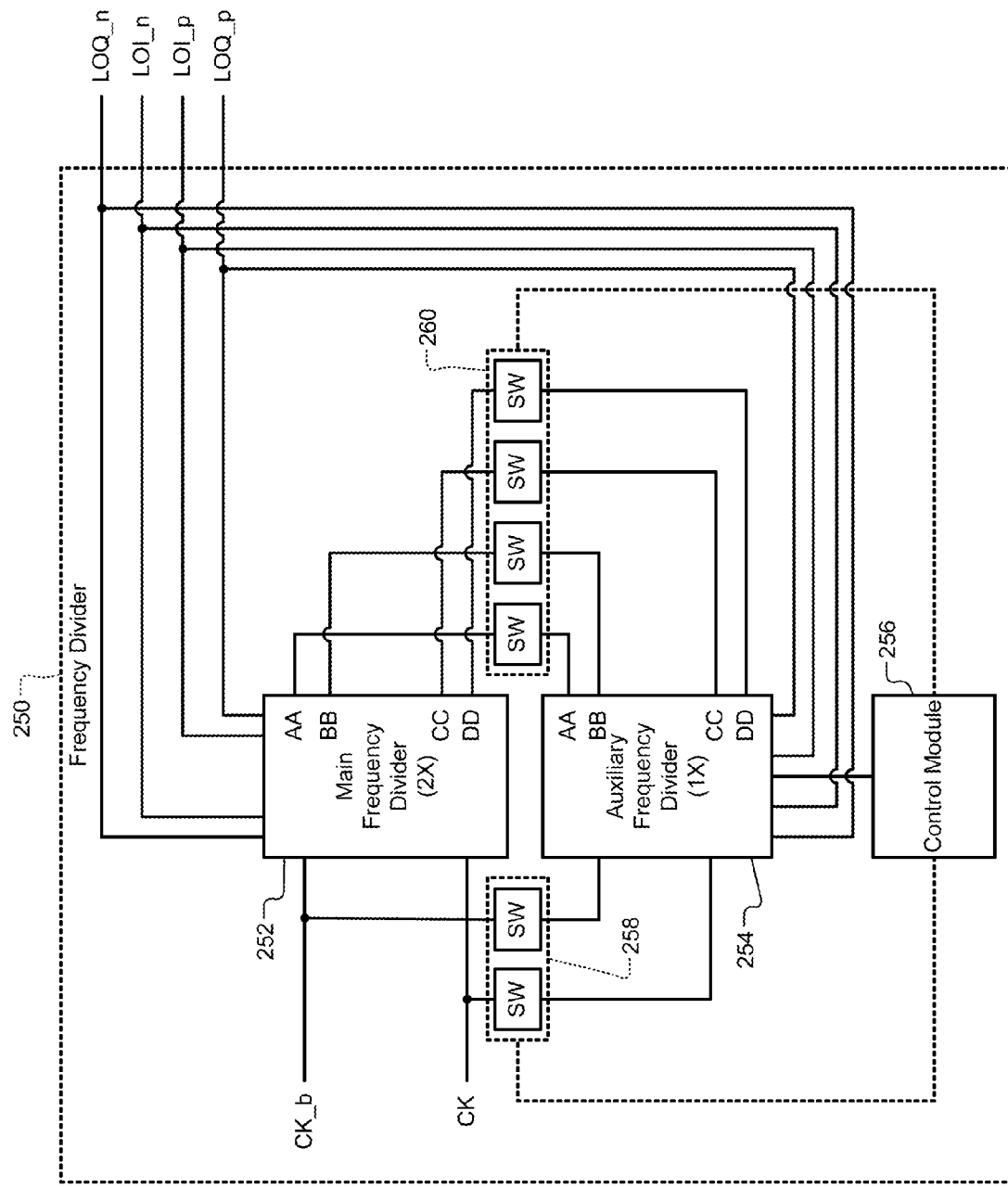

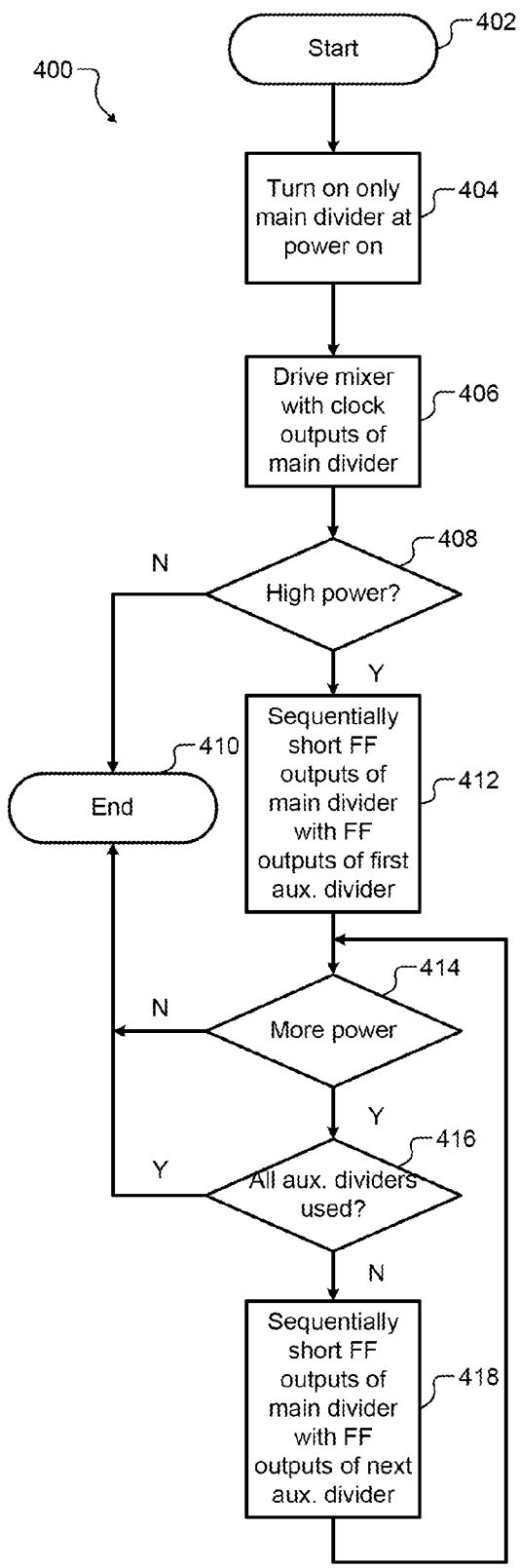
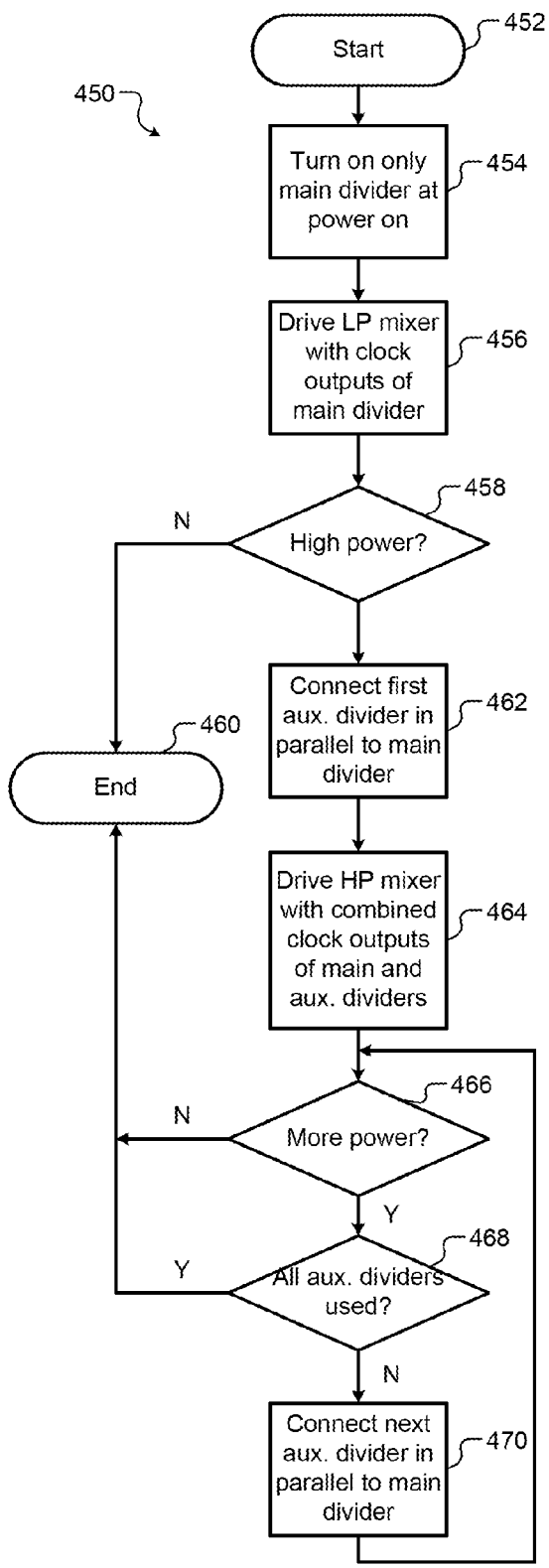
FIG. 7
FIG. 8

MODULAR FREQUENCY DIVIDER WITH SWITCH CONFIGURATION TO REDUCE PARASITIC CAPACITANCE

CROSS-REFERENCE TO RELATED APPLICATIONS

This application is a continuation-in-part of U.S. patent application Ser. No. 13/892,818, filed on May 13, 2013, which is a continuation of U.S. patent application Ser. No. 13/194,089, filed on Jul. 29, 2011 (now U.S. Pat. No. 8,442,562), which claims the benefit of U.S. Provisional Application No. 61/368,935, filed on Jul. 29, 2010 and U.S. Provisional Application No. 61/480,335, filed on Apr. 28, 2011. This application claims the benefit of U.S. Provisional Application No. 61/826,235, filed on May 22, 2013. The entire disclosures of the above applications are incorporated herein by reference.

FIELD

The present disclosure relates generally to communication systems and more particularly to modular frequency dividers used in transmitters that use switch configurations to reduce parasitic capacitance.

BACKGROUND

The background description provided herein is for the purpose of generally presenting the context of the disclosure. Work of the presently named inventors, to the extent the work is described in this background section, as well as aspects of the description that may not otherwise qualify as prior art at the time of filing, are neither expressly nor impliedly admitted as prior art against the present disclosure.

Referring now to FIG. 1A, a transmitter 100 of a wireless device is shown for example only. The transmitter 100 includes a baseband processing module 102, an upconverter module 104, a power amplifier module 106, and an antenna 108. While a single antenna is shown, the transmitter 100 may include multiple antennas. For example only, the multiple antennas may be arranged in a multiple-input multiple-output (MIMO) configuration. The baseband processing module 102 generates baseband signals that include data to be transmitted by the transmitter 100. The upconverter module 104 upconverts the baseband signals to radio frequency (RF) signals. The power amplifier module 106 amplifies the RF signals and transmits the amplified RF signals via the antenna 108.

Referring now to FIG. 1B, an example of the transmitter 100 is shown. The baseband processing module 102 outputs an in-phase (I) signal and a quadrature phase (Q) signal that include the data to be transmitted by the transmitter 100. The upconverter module 104 includes low-pass filter (LPF) modules 110 and 112 to remove high-frequency noise in the I and Q channels, respectively. The filtered I and Q signals are input to mixers 114 and 116. The mixers 114, 116 may be called I-channel and Q-channel mixers (or I and Q mixers), respectively.

The I and Q mixers 114, 116 upconvert the I and Q signals from baseband frequency to radio frequency (RF). The I and Q mixers 114, 116 are driven by clock signals having a predetermined reference frequency. The clock signals are generated by a local oscillator (OSC) 118, a frequency divider (DIV) 120, and a −90° phase shifter 121. A summer 122 combines upconverted RF outputs of the I and Q mixers 114, 116 into a signal that is input to the power amplifier module 106. The power amplifier module 106 amplifies the signal and drives the antenna 108, which transmits the signal.

SUMMARY

A system comprises a first frequency divider, a plurality of second frequency dividers, a first switch, and a plurality of second switches. The first frequency divider is configured to divide an input frequency of an input signal to generate a first signal having a first frequency and a first phase. The plurality of second frequency dividers are each configured to divide the input frequency of the input signal to generate a second signal having the first frequency and a second phase. The first switch includes a first end connected to a first node of the first frequency divider, and a second end connected to a second node of a first one of the plurality of second frequency dividers. The plurality of second switches include first ends connected to the second end of the first switch, and second ends respectively connected to the second nodes of the plurality of second frequency dividers other than the first one of the plurality of second frequency dividers.

In other features, the first frequency divider includes a first plurality of components connected to the first node, and each of the second frequency dividers includes a second plurality of components connected to the second node.

In other features, the first plurality of components of the first frequency divider has a first area, and the second plurality of components of each of the second frequency dividers has a second area that is less than the first area.

In another feature, the system further comprises a control module configured to sequentially connect the plurality of second frequency dividers in parallel to the first frequency divider by initially closing the first switch and subsequently closing one or more of the plurality of second switches.

In another feature, in response to the control module connecting the plurality of second frequency dividers to the first frequency divider, the second phase of the second signal generated by the plurality of second frequency dividers matches the first phase of the first signal generated by the first frequency divider.

In other features, the first frequency divider includes a third plurality of components connected to a third node, and each of the plurality of second frequency dividers includes a fourth plurality of components connected to a fourth node. The system further comprises a third switch including a first end connected to the third node, and a second end connected to the fourth node of the first one of the plurality of second frequency dividers. A plurality of fourth switches include first ends connected to the second end of the third switch, and second ends respectively connected to the fourth nodes of the plurality of second frequency dividers other than the first one of the plurality of second frequency dividers.

In another feature, the control module is configured to initially close the third switch with the first switch and close one or more of the plurality of the fourth switches respectively with the plurality of second switches.

In other features, the first and third plurality of components of the first frequency divider has a first area, and the fourth plurality of components of each of the second frequency dividers has a second area that is less than the first area.

In other features, in response to the control module not closing the first switch and the plurality of the second switches, a capacitance at the first node includes a parasitic capacitance of only the first switch. In response to the control module not closing the third switch and the plurality of the fourth switches, a capacitance at the third node includes a parasitic capacitance of only the third switch.

In other features, the system further comprises a mixer configured to upconvert a transmit signal using a clock signal. The clock signal includes the first signal generated by the first frequency divider and the second signal generated by the one of the second frequency dividers.

In other features, each of the first and second frequency dividers is further configured to divide the input signal by a first factor when the transmit signal is transmitted in a first frequency band, and divide the input signal by a second factor when the transmit signal is transmitted in a second frequency band. The second factor is different than the first factor, and the second band is different than the first band.

In other features, the system further comprises a first mixer configured to upconvert a transmit signal using a first clock signal. The first clock signal includes the first signal generated by the first frequency divider. A second mixer is configured to upconvert the transmit signal using a second clock signal. The second clock signal includes the first signal generated by the first frequency divider and the second signal generated by each of the plurality of second frequency dividers connected to the first frequency divider. The control module is configured to activate only the first mixer when the transmit signal is transmitted at a first power level, and to deactivate the first mixer and activate the second mixer when the transmit signal is transmitted at a second power level that is greater than the first power level.

In other features, the first mixer includes components having a first area, and the second mixer includes components having a second area that is greater than the first area.

In another feature, a number of the second frequency dividers connected in parallel to the first frequency divider depends on the first and second power levels.

In still other features, a method comprises generating a first signal having a first frequency and a first phase by dividing an input frequency of an input signal using a first frequency divider, and generating a second signal having the first frequency and a second phase by dividing the input frequency of the input signal using a plurality of second frequency dividers. The method further comprises connecting a first end of a first switch to a first node of the first frequency divider, connecting a second end of the first switch to a second node of a first one of the plurality of second frequency dividers, connecting first ends of a plurality of second switches to the second end of the first switch, and connecting second ends of the plurality of second switches respectively to the second nodes of the plurality of second frequency dividers other than the first one of the plurality of second frequency dividers.

In another feature, the method further comprises sequentially connecting the plurality of second frequency dividers in parallel to the first frequency divider by initially closing the first switch and subsequently closing one or more of the plurality of second switches.

In another feature, in response to connecting the plurality of second frequency dividers to the first frequency divider, the second phase of the second signal generated by the plurality of second frequency dividers matches the first phase of the first signal generated by the first frequency divider.

In another feature, in response to not closing the first switch and the plurality of the second switches, a capacitance at the first node includes a parasitic capacitance of only the first switch.

In another feature, the method further comprises upconverting a transmit signal using a clock signal. The clock signal includes the first signal generated by the first frequency divider and the second signal generated by the one of the second frequency dividers.

In other features, the method further comprises dividing the input signal by a first factor when the transmit signal is transmitted in a first frequency band, and dividing the input signal by a second factor when the transmit signal is transmitted in a second frequency band. The second factor is different than the first factor, and the second band is different than the first band.

Further areas of applicability of the present disclosure will become apparent from the detailed description, the claims and the drawings. The detailed description and specific examples are intended for purposes of illustration only and are not intended to limit the scope of the disclosure.

BRIEF DESCRIPTION OF DRAWINGS

The present disclosure will become more fully understood from the detailed description and the accompanying drawings, wherein:

FIG. 1A is a functional block diagram of a transmitter;

FIG. 1B depicts an example of a transmitter;

FIG. 2C is a functional block diagram of a frequency divider including two frequency dividers that can be used in parallel to increase or decrease the size of the frequency divider;

FIG. 7 is a flowchart of a method for connecting outputs of main and auxiliary frequency dividers;

FIG. 8 is a flowchart of a method for connecting multiple frequency dividers in parallel;

DESCRIPTION

Figure 2A:
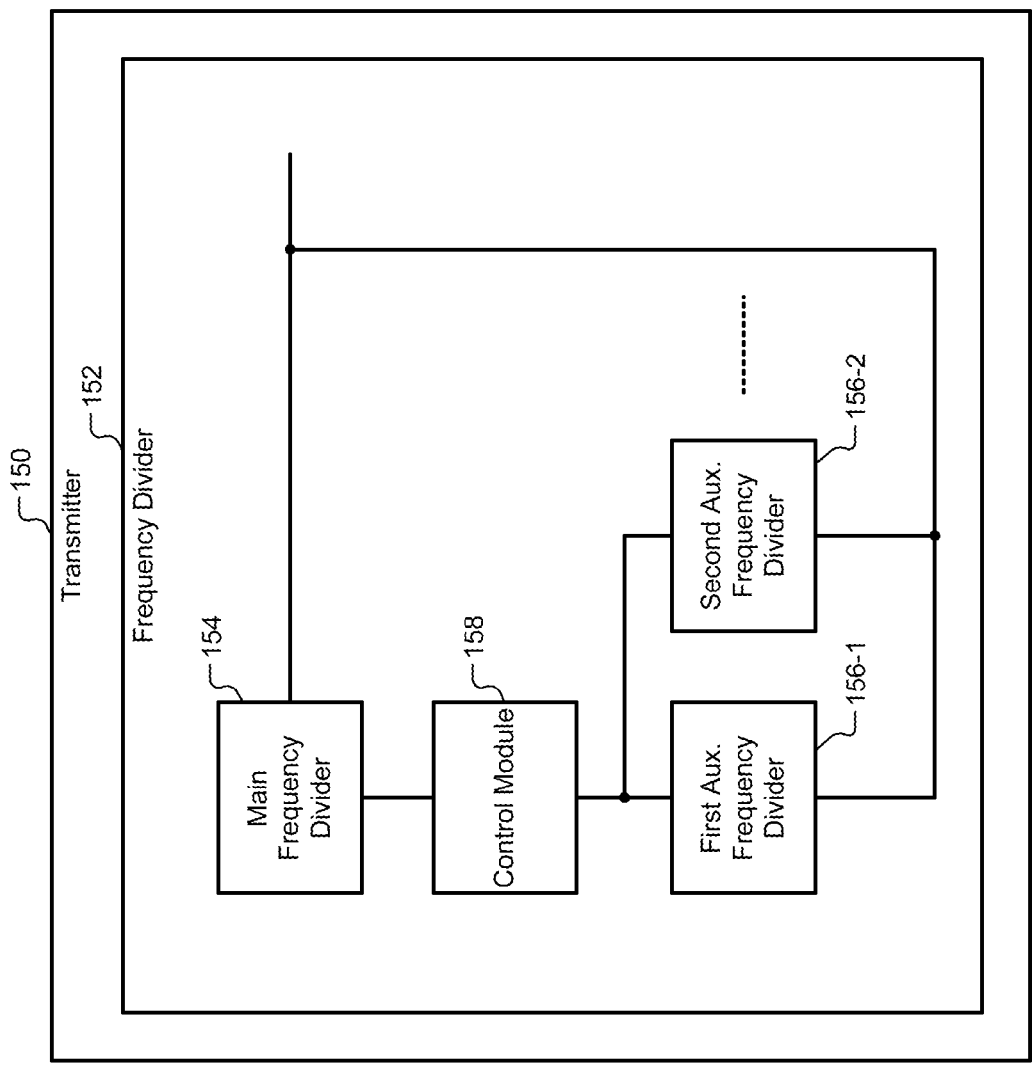
FIG. 2A is a functional block diagram of a transmitter including a main frequency divider and a plurality of auxiliary frequency dividers.

Referring now to FIG. 2A, a transmitter 150 including a frequency divider 152 is shown. The frequency divider 152 includes a main frequency divider 154 and a plurality of auxiliary frequency dividers (e.g., a first auxiliary frequency divider 156-1, a second auxiliary frequency divider 156-2, and so on (collectively auxiliary frequency dividers 156)), and a control module 158. The control module 158 turns on the main frequency divider 154 when the transmitter 150 is turned on. As the power requirement increases, the control module 158 turns on one or more of the auxiliary frequency dividers 156.

Phase noise is an important consideration in transmitter design. Phase noise is a frequency-domain representation of rapid, short-term, random fluctuations in a phase of a waveform caused by time-domain instabilities (jitter). Generally, in the analog domain, phase noise refers to phase noise of an oscillator, whereas in the digital domain, phase noise refers to jitter of a clock.

When a transmitter is set to operate at a maximum output power level, phase noise performance at frequencies far away from a carrier frequency of the transmitter can adversely impact data transmitted by the transmitter. Often, however, transmitters operate at power levels below maximum output power levels, where phase noise performance can be relaxed.

In most transmitters, local oscillators include a crystal oscillator, which generates a signal at a natural frequency of the crystal oscillator (typically few tens of a megahertz), a Phase-Locked Loop (PLL) that generates a higher tunable frequency (typically few gigahertz), and one or more frequency dividers (e.g., the main frequency divider 154 and one or more of the auxiliary frequency dividers 156). The frequency dividers generate a clock of a desired frequency. The clock, which is typically called LO, is then used to drive mixers (not shown).

The frequency dividers are generally used in parallel as shown. Initially, only the main frequency divider 154 is turned on when the transmitter 150 is turned on. When the output power requirement of the transmitter 150 increases and the phase noise performance starts becoming critical, one or more auxiliary frequency dividers 156 are turned on and added in parallel to the main frequency divider 154 by the control module 158. Thereafter, when the output power requirement of the transmitter 150 decreases and the phase noise performance becomes less critical, one or more of the auxiliary frequency dividers 156 are turned off and disconnected from the main frequency divider 154.

When the main frequency divider is turned on, the initial phase of the main frequency divider is unknown. Accordingly, when an auxiliary frequency divider is subsequently turned on and added in parallel to the main frequency divider, the phase of the auxiliary frequency divider may be in phase or delayed by 180 degrees relative to the phase of the main frequency divider since it is impossible to set the initial phase of either frequency dividers.

Frequency dividers contribute substantially to the overall far away phase noise performances (e.g., 20-50 MHz far away from the carrier frequency) at the maximum output power level of the power amplifier (PA) stage of the transmitters. Phase noise decreases as the size of components of the frequency dividers increases. Increasing the size of the components, however, also increases power consumption.

The present disclosure relates to a system to synchronize the phase of each frequency divider added to the main frequency divider to the phase of the main frequency divider. Specifically, multiple switches are used to connect internal nodes of an additional frequency divider to internal nodes of the main frequency divider when the additional frequency divider is connected in parallel to the main frequency divider. The switches are closed simultaneously. The phase of the additional frequency divider is synchronized to the phase of the first frequency divider by synchronizing the operation of the switches.

Further, when multiple frequency dividers are added to the main frequency divider, only one additional frequency divider is connected in parallel to the main frequency divider at a time. A plurality of frequency dividers are not connected in parallel to the main frequency divider at the same time. For example, a first additional frequency divider is connected to the main frequency divider at a first time; a second additional frequency divider is connected to the main frequency divider at a second time following the first time, and so on. In other words, each additional frequency divider is sequentially connected to the main frequency divider. When any additional frequency divider is connected to the main frequency divider, the switches that connect the internal nodes of the additional frequency divider to the internal nodes of the main frequency divider are closed simultaneously.

Additionally, each frequency divider connected to the main frequency divider includes components that are smaller in size (area) than the components of the main frequency divider. For example, the length of the metal-oxide semiconductor (MOS) devices used in the main frequency divider and each additional frequency divider is kept the same, and the width of the MOS devices used in each additional frequency divider is less relative to the width of the MOS devices used in the main frequency divider. Accordingly, the components of each additional frequency divider connected to the main frequency divider have smaller power ratings and smaller parasitic capacitances than the components of the main frequency divider. The sequential operation of the switches and the smaller area of components of each added frequency divider ensure that each added frequency divider has substantially the same phase as the main frequency divider when each additional frequency divider is connected to the main frequency divider in parallel. That is, the phase of each frequency divider added to the main frequency divider follows the phase of the main frequency divider.

Figure 2B:
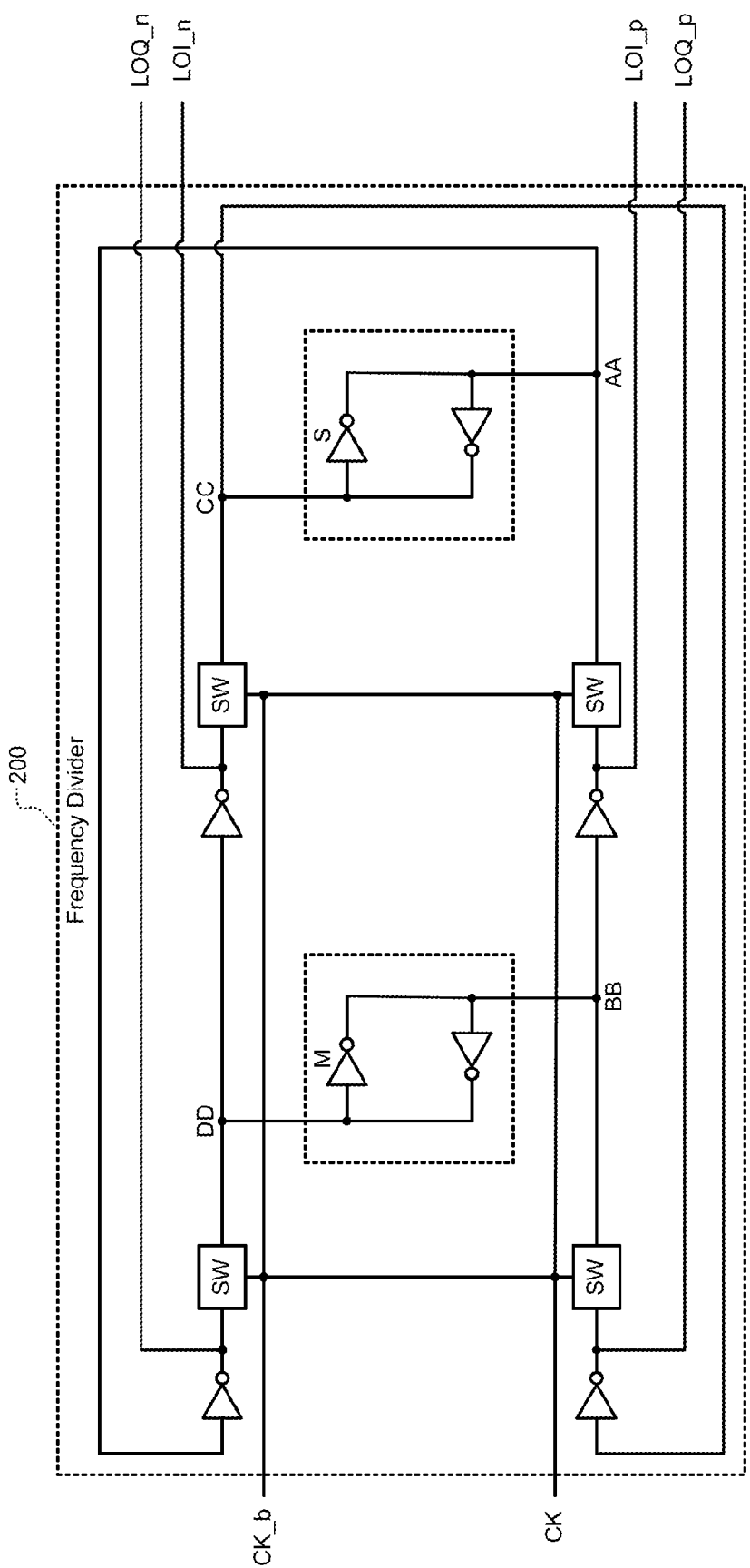
FIG. 2B is a functional block diagram of a frequency divider of a transmitter.

Referring now to FIG. 2B, a frequency divider 200 is shown for example only. The frequency divider 200 divides the frequency of a clock signal CK generated by a crystal oscillator (not shown). The frequency of the clock signal CK depends on the frequency band in which the transmitter operates. When the transmitter can operate in more than one frequency band, the clock signal CK can be switched depending on the frequency band in which the transmitter operates.

The frequency divider 200 includes a master-slave flip-flop and four switches (SW) arranged as shown. The four switches are clocked by the clock signal CK and by a complement of the clock signal CK (CK_b) as shown. By dividing the clock signal CK, the frequency divider 200 generates four output clock signals LOQ_n, LOI_n, LOI_p, and LOQ_p (collectively I and Q channel clock signals) that are used to drive I and Q mixers of a transmitter.

In a frequency divider, the phase noise can be decreased by increasing the size (area) of the components of the frequency divider. When the size of the components is increased, however, the power consumed by the components increases. Further, when the transmitter is turned on (i.e., when power is supplied to the transmitter), the frequency divider turns on, and the initial phase of the frequency divider is unknown since states of the master-slave flip-flops when the power is turned on are unknown. Accordingly, when an additional frequency divider is added to the main frequency divider in parallel, the phase of the additional frequency divider can be different than the phase of the main frequency divider and can have 180 degrees of phase delay and can corrupt the LO signal.

Referring now to FIG. 2C, a frequency divider 250 includes a main frequency divider 252, an auxiliary frequency divider 254, a control module 256, switches 258, and switches 260. The main frequency divider 252 includes components having a greater size (area) than the components of the auxiliary frequency divider 254. For example only, let 2X and X respectively denote the sizes of the components of the first and second frequency dividers 252, 254. Each of the first and second frequency dividers 252, 254 has the structure of the frequency divider 200 shown in FIG. 2B. Accordingly, each of the first and second frequency dividers 252, 254 has flip-flop internal nodes AA, BB, CC, and DD.

When the transmitter is turned on, only the main frequency divider 252 turns on, and the main frequency divider 252 divides the clock signal CK and generates the I and Q channel clock signals used to drive I and Q mixers of the transmitter (e.g., mixers 114, 116 shown in FIG. 1B). In the example shown, the I and Q channel clock signals are inverted versions of the flip-flop internal nodes AA through DD.

When the transmitter is turned on, the auxiliary frequency divider 254 is kept off and is not connected to the main frequency divider 252. Specifically, when power is initially supplied to the transmitter, the control module 256 does not turn on the switches 258 that supply the clock signals CK and CK_b to the auxiliary frequency divider 254. Additionally, the control module 256 does not turn on the switches 260 that connect the auxiliary frequency divider 254 in parallel to the main frequency divider 252.

When the auxiliary frequency divider 254 is to be connected in parallel to the main frequency divider 252, the control module 256 turns on the auxiliary frequency divider 254. Additionally, the control module 256 turns on the switches 258, which supply the clock signals CK and CK_b to the auxiliary frequency divider 254. The control module 256 sequentially turns on the switches 260 to connect the flip-flop internal nodes AA, BB, CC, and DD of the auxiliary frequency divider 254 to the corresponding flip-flop internal nodes AA, BB, CC, and DD of the main frequency divider 252. The switches 260 simultaneously connect the flip-flop internal nodes AA, BB, CC, and DD of the auxiliary frequency divider 254 to the flip-flop internal nodes AA, BB, CC, and DD of the main frequency divider 252, respectively.

The switches 260 include pass transistors, which have a small area (size) and a small parasitic capacitance. The pass transistors therefore do not load the flip-flop internal nodes AA, BB, CC, and DD of the main frequency divider 252 when connecting the flip-flop internal nodes AA, BB, CC, and DD of the auxiliary frequency divider 254 to the flip-flop internal nodes AA, BB, CC, and DD of the main frequency divider 252, respectively.

When the switches 260 connect the respective flip-flop internal nodes of the first and second frequency dividers 252, 254 as described above, the flip-flop outputs of the auxiliary frequency divider 254 have substantially the same phase as the phase of the flip-flop outputs of the main frequency divider 252, respectively. In other words, the flip-flop outputs of the main frequency divider 252, which has larger components than the auxiliary frequency divider 254, force the flip-flop outputs of the auxiliary frequency divider 254 to have the same phase as the phase of the flip-flop outputs of the main frequency divider 252 when the auxiliary frequency divider 254 is connected to the main frequency divider 252 as described above. The phase of the flip-flop outputs of the auxiliary frequency divider 254 follows the phase of the flip-flop outputs of the main frequency divider 252 regardless of the order in which the main frequency divider 252 and the auxiliary frequency divider 254 are turned on.

In some implementations, the main frequency divider 252 may include components having a smaller size (area) than the components of the auxiliary frequency divider 254. For example only, suppose that X and 2X respectively denote the sizes of the components of the first and second frequency dividers 252, 254. Suppose further that the main frequency divider 252 is initially turned on when the power is supplied to the transmitter and that the auxiliary frequency divider 254 is added as described above.

In this example, when the switches 260 connect the flip-flop internal nodes of the auxiliary frequency divider 254 to the respective flip-flop internal nodes of the main frequency divider 252 as described above, the flip-flop outputs of the main frequency divider 252 have substantially the same phase as the phase of the flip-flop outputs of the auxiliary frequency divider 254. In other words, the flip-flop outputs of the auxiliary frequency divider 254, which has larger components than the main frequency divider 252, force the flip-flop outputs of main frequency divider 252 to have the same phase as the phase of the flip-flop outputs of the auxiliary frequency divider 254 when the auxiliary frequency divider 254 is connected to the main frequency divider 252 as described above.

In some applications, more than two frequency dividers may be used in parallel. When the transmitter is turned on, a main frequency divider turns on. Subsequently, as power requirement of the transmitter increases, one or more frequency dividers may be turned on and connected in parallel to the main frequency divider. Each additional frequency divider has a smaller area than the main frequency divider and is turned on sequentially. The additional frequency dividers may be disconnected from the main frequency divider as the power requirement of the transmitter decreases. Components of the additional frequency dividers have smaller areas (and therefore smaller power ratings and parasitic capacitances) than the components of the main frequency divider. For example only, the main frequency divider may have components having an area of 2X, and each of the additional frequency dividers may have components having an area of X.

Further, the transmitter may include two mixers. A first mixer is used when the transmitter operates in a low-power mode and is called a low-power mixer. A second mixer is used when the transmitter operates in a high-power mode and is called a high-power mixer. The area (size) of the components of the low-power mixer is less than the area of the components of the high-power mixer.

Figure 3A:
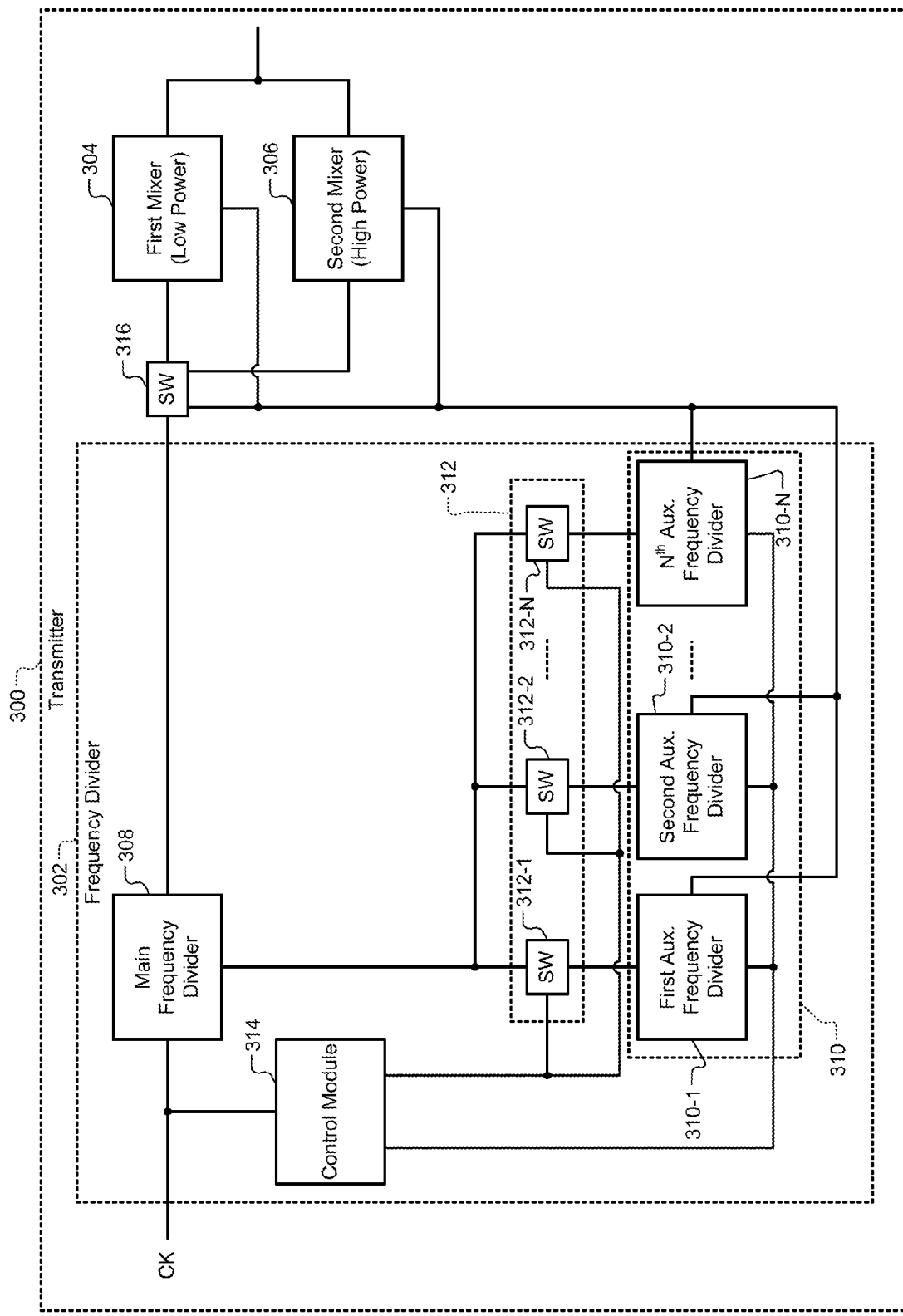
FIG. 3A is functional block diagram of a transmitter including a frequency divider and two mixers.

Referring now to FIG. 3A, a transmitter 300 includes a frequency divider 302, a first mixer 304, and a second mixer 306. Throughout the present disclosure (e.g., in FIGS. 2A, 2C, and 3A-6), only clock inputs to the mixers are shown, and baseband inputs to the mixers are omitted for simplicity of illustration. The first mixer 304 is a low-power mixer that is used when the transmitter 300 operates in a low-power mode. The second mixer 306 is a high-power mixer that is used when the transmitter 300 operates in a high-power mode. The area (size) of the components of the first mixer 304 is less than the area of the components of the second mixer 306. For example only, the area of the components of the first mixer 304 may be 3X, and the area of the components of the second mixer 306 may be 20X.

The frequency divider 302 includes a main frequency divider 308; a plurality of auxiliary frequency dividers 310-1, 310-2, . . . , and 310-N, where N is an integer greater than 1 (collectively auxiliary frequency dividers 310); switches 312-1, 312-2, . . . , and 312-N (collectively switches 312); and a control module 314. The main frequency divider 308 includes components having area greater (e.g., 2X) than the components of each of the auxiliary frequency dividers 310 (e.g., X). The components of each of the auxiliary frequency dividers 310 have the same area (e.g., X).

In some implementations, components of each of the auxiliary frequency dividers 310 have different area. For example, the components of a first one of the auxiliary frequency dividers 310 may have a different area than the components of a second one of the auxiliary frequency dividers 310. The area of the components of each of the first and second ones of the auxiliary frequency dividers 310, however, should be less than the area of the components of the main frequency divider 308. For example only, the area of the components of the main frequency divider 308 may be 4X. The area of the components of the first one of the auxiliary frequency dividers 310 may be X. The area of the components of the second one of the auxiliary frequency dividers 310 may be 2X.

The control module 314 controls the switches 312 and the switch 316. Additionally, the control module 314 turns on and off the auxiliary frequency dividers 310 and the first and second mixers 304, 306. As used herein, activating or turning on a device can include supplying power and/or clock to the device, and deactivating or turning off a device can include disconnecting power supply and/or clock from the device. A device is said to be in an active mode when turned on and in an inactive mode (also called a power-save mode or sleep mode) when turned off.

When the transmitter 300 is turned on, the main frequency divider 308 turns on. The control module 314 turns on the first mixer 304 and does not turn on the auxiliary frequency dividers 310 and the second mixer 306. Accordingly, at power on, the transmitter 300 operates in the low-power mode. The main frequency divider 308 divides the clock signal CK and generates the I and Q channel clock signals. The first mixer 304 upconverts the baseband signals using the I and Q channel clock signals.

For simplicity of illustration, only CK is used to show the clock signal. It should be understood that the clock signal includes the clock signals CK and CK-b as shown in FIGS. 2A and 2B. Further, it should be understood that different clock signals may be selected depending on the frequency band in which the transmitter 300 operates (e.g., 2G, 3G, etc.).

Subsequently, when more power is needed, the control module 314 turns off the first mixer 304 and turns on the second mixer 306 using the switch 316. Additionally, using the switches 312, the control module 314 turns on one or more of the auxiliary frequency dividers 310 and sequentially connects the one or more auxiliary frequency dividers 310 in parallel to the main frequency divider 308 as described above. For example, switches 312-1 connect the first auxiliary frequency divider 310-1 to the main frequency divider 308 at a first time; switches 312-2 connect the second auxiliary frequency divider 310-2 to the main frequency divider 308 at a second time; and so on. Each of the switches 312-1, 312-2, etc. includes a set of switches that simultaneously connect the internal nodes of a selected one of the auxiliary frequency dividers 310 to the internal nodes of the main frequency divider 308 as described above when the selected one of the auxiliary frequency dividers 310 is connected to the main frequency divider 308 in parallel. This is shown and described in further detail with reference to FIG. 6 below.

The control module 314 supplies the clock signal CK to the one or more of the auxiliary frequency dividers 310 that are turned on. The transmitter 300 now operates in the high-power mode. The main frequency divider 308 and the one or more of the auxiliary frequency dividers 310 that are sequentially connected to the main frequency divider 308 divide the clock signal CK and generate the I and Q channel clock signals. The second mixer 306 upconverts the baseband signals using the I and Q channel clock signals generated by the main frequency divider 308 and the one or more of the auxiliary frequency dividers 310. The sequential operation of the switches 312 and the smaller area of components of the auxiliary frequency dividers 310 ensure that each added auxiliary frequency divider 310 has substantially the same phase as the main frequency divider 308 when each auxiliary frequency divider 310 is connected to the main frequency divider 308 in parallel.

When the power requirement of the transmitter 300 decreases, depending on the power requirement of the transmitter 300, the control module 314 disconnects and turns off (i.e., deactivates) one or more of the auxiliary frequency dividers 310 from the main frequency divider 308. For example only, using the switches 312, the control module 314 may sequentially disconnect one or more of the auxiliary frequency dividers 310 from the main frequency divider 308 in an opposite order than the order in which the one or more of the auxiliary frequency dividers 310 were connected to the main frequency divider 308 (e.g., divider connected last is disconnected first, etc.).

The control module 314 may keep the second mixer 306 turned on until at least one of the auxiliary frequency dividers 310 is connected to the main frequency divider 308. When a last one of the auxiliary frequency dividers 310 is disconnected from the main frequency divider 308, the control module 314 turns on the first mixer 304 and turns off the second mixer 306. The transmitter 300 now operates in the low-power mode.

Figure 3B:
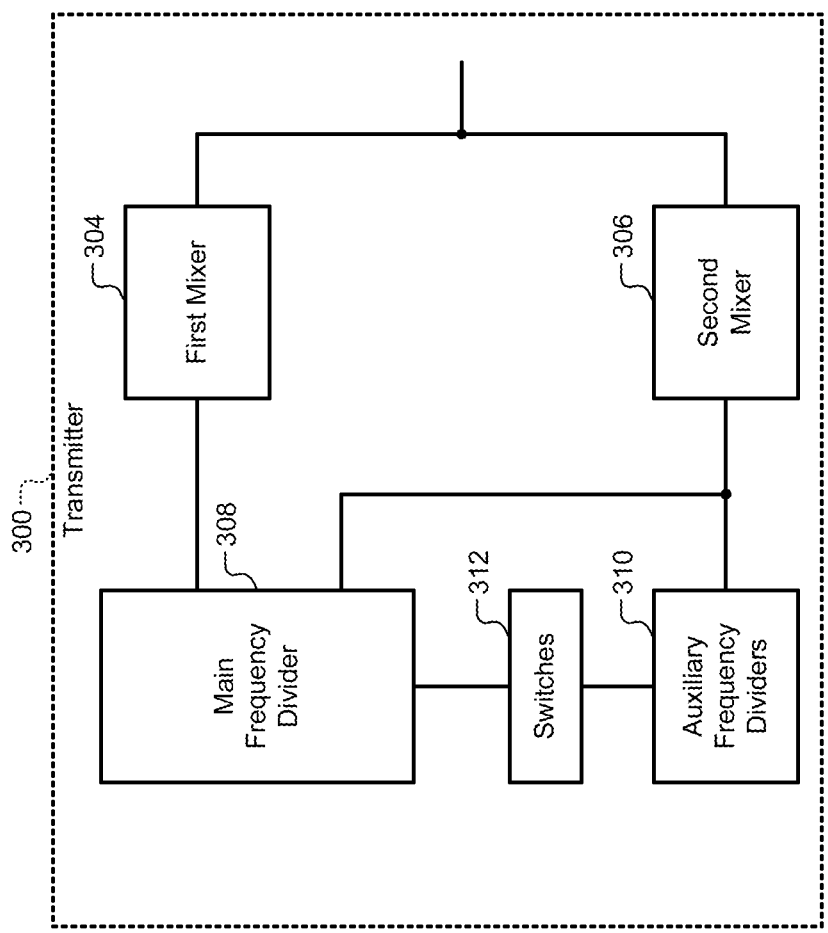
FIG. 3B is a simplified block diagram of the transmitter of FIG. 3A.

Referring now to FIG. 3B, a simplified block diagram of the transmitter 300 is shown. As described above, the main frequency divider 308 drives the first mixer 304 when the transmitter 300 operates in the low-power mode and drives the second mixer 306 when the transmitter 300 operates in the high-power mode. Accordingly, the main frequency divider 308 outputs two sets of I and Q channel clock signals. A first set of I and Q channel clock signals drives the first mixer 304 when the transmitter 300 operates in the low-power mode. A second set of I and Q channel clock signals drives the second mixer 306 when the transmitter 300 operates in the high-power mode. The second set of I and Q channel clock signals are combined (e.g., shorted) with respective I and Q channel clock signals generated by the one or more of the auxiliary frequency dividers 310 when the one or more of the auxiliary frequency dividers 310 are connected in parallel to the main frequency divider 308. The second set of I and Q channel clock signals, combined with the I and Q channel clock signals generated by the one or more of the auxiliary frequency dividers 310, drive the second mixer 306 when the transmitter 300 operates in the high-power mode.

Figure 4:
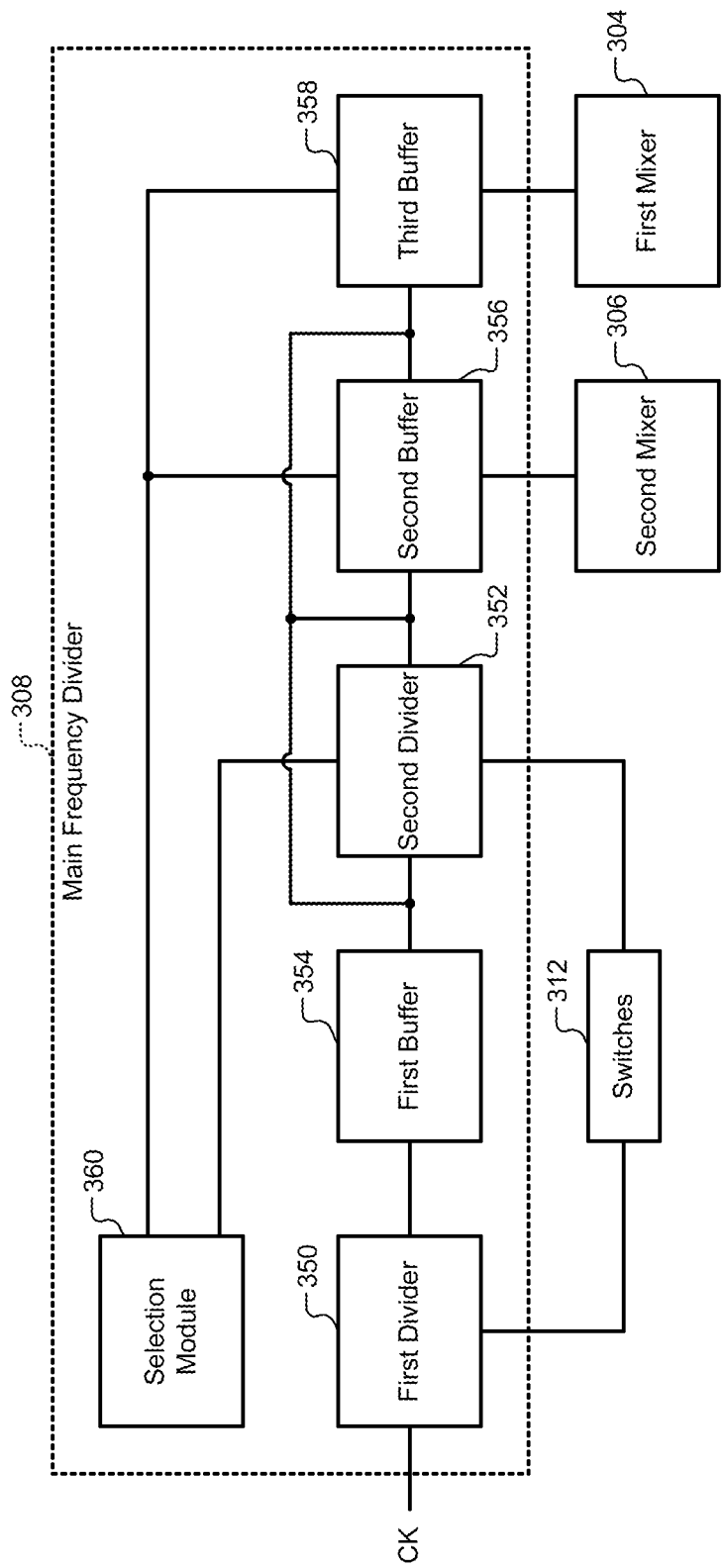
FIG. 4 is a functional block diagram of the main frequency divider of FIG. 3A.

Referring now to FIG. 4, the main frequency divider 308 is shown in detail. The main frequency divider 308 includes a first divider 350, a second divider 352, a first buffer 354, a second buffer 356, a third buffer 358, and a selection module 360. Each of the first and second dividers 350, 352 has the structure of the frequency divider 200 shown in FIG. 2B.

The transmitter 300 can operate in a high-frequency band or a low-frequency band. The control module 314 detects whether the transmitter 300 operates in the high-frequency band or the low-frequency band. The selection module 360 communicates with the control module 314. When the transmitter 300 operates in the low-frequency band, the selection module 360 selects only the first divider 350 to divide the clock signal CK (e.g., to divide by 2). When the transmitter 300 operates in the high-frequency band, the selection module 360 selects the first and second dividers 350, 352 to divide the clock signal CK (e.g., to divide by 4).

In either frequency band, the main frequency divider 308 outputs the first and second sets of I and Q channel clock signals to the first and second mixers 304, 306, respectively. The selection module 360 selects/deselects the second divider 352 depending on the frequency band in which the transmitter 300 operates. In either frequency band, the selection module 360 selects the first, second, and third buffers 354, 356, 358 to output the first and second sets of I and Q channel clock signals to the first and second mixers 304, 306, respectively. The control module 314 operates the switches 312 to connect the flip-flop internal nodes of the first and second dividers 350, 352 to corresponding flip-flop internal nodes of one or more of the auxiliary frequency dividers 310. The control module 314 activates/deactivates the first and second mixers 304, 306 depending on whether the transmitter 300 operates in the low-power or high-power mode.

Figure 5:
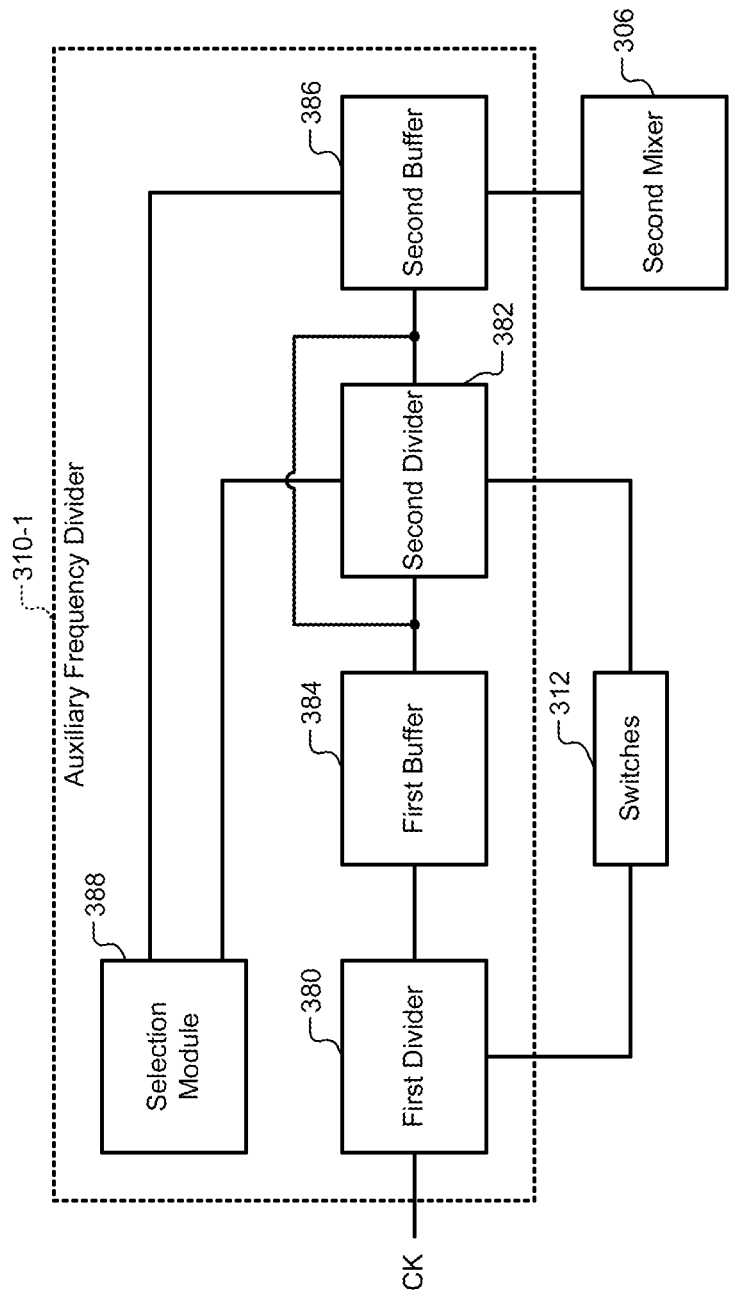
FIG. 5 is a functional block diagram of an auxiliary frequency divider of FIG. 3A.

Referring now to FIG. 5, one of the auxiliary frequency dividers 310 (e.g., the first auxiliary frequency divider 310-1) is shown in detail. The first auxiliary frequency divider 310-1 includes a first divider 380, a second divider 382, a first buffer 384, a second buffer 386, and a selection module 388. Each of the first and second dividers 380, 382 has the structure of the frequency divider 200 shown in FIG. 2B.

The selection module 388 communicates with the control module 314. When the transmitter 300 operates in the low-frequency band, the selection module 388 selects only the first divider 380 to divide the clock signal CK (e.g., to divide by 2). When the transmitter 300 operates in the high-frequency band, the selection module 388 selects the first and second dividers 380, 382 to divide the clock signal CK (e.g., to divide by 4).

In either frequency band, the first auxiliary frequency divider 310-1 outputs the I and Q channel clock signals to the second mixer 306. The selection module 388 selects/deselects the second divider 382 depending on the frequency band in which the transmitter 300 operates. In either frequency band, the selection module 388 selects the first and second buffers 384, 386 to output the I and Q channel clock signals to the second mixer 306. The control module 314 operates the switches 312 to connect the flip-flop internal nodes of the first and second dividers 380, 382 to corresponding flip-flop internal nodes of the main frequency divider 308. The control module 314 activates/deactivates the first and second mixers 304, 306 depending on whether the transmitter 300 operates in the low-power or high-power mode.

Figure 6:
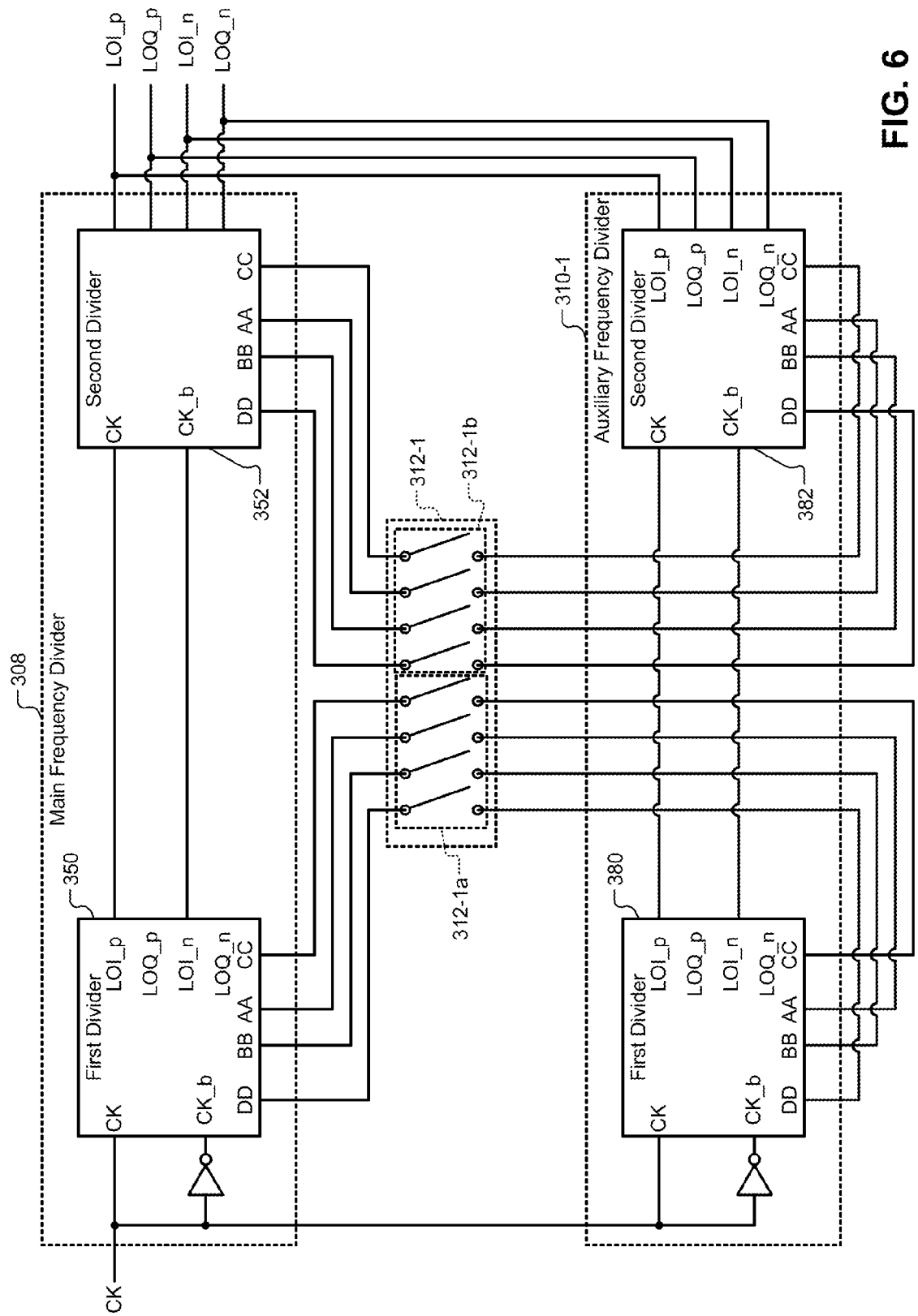
FIG. 6 depicts connections between the main frequency divider and an auxiliary frequency divider of FIG. 3A.

Referring now to FIG. 6, examples of connections between the first and second dividers of the main frequency divider 308 and one of the auxiliary frequency dividers 310 (e.g., the first auxiliary frequency divider 310-1) are shown in detail. The flip-flop internal nodes AA, BB, CC, and DD of the first divider 350 are simultaneously connected to the respective flip-flop internal nodes AA, BB, CC, and DD of the first divider 380 via the switches 312-1a when the first auxiliary frequency divider 310-1 is connected in parallel to the main frequency divider 308. The flip-flop internal nodes AA, BB, CC, and DD of the second divider 352 are simultaneously connected to the respective flip-flop internal nodes AA, BB, CC, and DD of the second divider 382 via the switches 312-1b when the first auxiliary frequency divider 310-1 is connected in parallel to the main frequency divider 308.

In the main frequency divider 308, the first divider 350 receives the clock signals CK and CK_b. The first divider 350 divides the clock signals CK and CK_b and generates the divided signals LOI_p, LOQ_p, LOI_n, and LOQ_n. The LOI_p and LOI_n outputs of the first divider 350 are input to the inputs CK and CK_b of the second divider 352, respectively. The second divider 352 divides the LOI_p and LOI_n outputs of the first divider 350 and generates the divided signals LOI_p, LOQ_p, LOI_n, and LOQ_n.

In the first auxiliary frequency divider 310-1, the first divider 380 receives the clock signals CK and CK_b. The first divider 380 divides the clock signals CK and CK_b and generates the divided signals LOI_p, LOQ_p, LOI_n, and LOQ_n. The LOI_p and LOI_n outputs of the first divider 380 are input to the inputs CK and CK_b of the second divider 382, respectively. The second divider 382 divides the LOI_p and LOI_n outputs of the first divider 350 and generates the divided signals LOI_p, LOQ_p, LOI_n, and LOQ_n.

When the first auxiliary frequency divider 310-1 is connected in parallel to the main frequency divider 308 and when the transmitter 300 operates in the first frequency band, the I and Q channel clock signals are generated as follows: Only the first dividers 350, 380 of the main and first auxiliary frequency dividers 308 and 310-1 are selected. The signals LOI_p, LOQ_p, LOI_n, and LOQ_n generated by the first dividers 350, 380 of the main and first auxiliary frequency dividers 308 and 310-1 are combined. The combined signals LOI_p, LOQ_p, LOI_n, and LOQ_n are used to drive the first and/or second mixers 304, 306. The procedure is repeated when each one of the auxiliary frequency dividers 310 is connected in parallel to the main frequency divider 308.

When the first auxiliary frequency divider 310-1 is connected in parallel to the main frequency divider 308 and when the transmitter 300 operates in the second frequency band, the I and Q channel clock signals are generated as follows: The first and second dividers 350, 380, 352, 382 of the main and first auxiliary frequency dividers 308 and 310-1 are selected. The signals LOI_p, LOQ_p, LOI_n, and LOQ_n generated by the second dividers 352, 382 of the main and first auxiliary frequency dividers 308 and 310-1 are combined. The combined signals LOI_p, LOQ_p, LOI_n, and LOQ_n are used to drive the first and/or second mixers 304, 306. The procedure is repeated when each one of the auxiliary frequency dividers 310 is connected in parallel to the main frequency divider 308.

Referring now to FIG. 7, an example of a method 400 for operating a transmitter is shown. Control begins at 402. At 404, control turns on only the frequency divider having a component size 2X and does not turn on any frequency dividers having a component size 1X, for example. At 406, control drives a mixer using clock signals generated by the 2X frequency divider. At 408, control determines if high transmit power is needed. Control ends at 410 if high transmit power is not needed.

At 412, if high transmit power is needed, control turns on a first 1X frequency divider and sequentially connects flip-flop internal nodes AA, BB, CC, and DD of the 2X frequency divider to flip-flop internal nodes AA, BB, CC, and DD of the first 1X frequency divider. Control combines the clock signals generated by the 2X frequency divider and the clock signals generated by the first 1X frequency divider, and control drives the mixer using the combined clock signals.

At 414, control determines if additional transmit power is needed. Control ends at 410 if additional transmit power is not needed. At 416, if additional transmit power is needed, control determines if any additional 1X frequency dividers can be used. Control ends at 410 if no additional 1X frequency dividers can be used. At 418, if any additional 1X frequency dividers can be used, control turns on a next 1X frequency divider and sequentially connects flip-flop internal nodes AA, BB, CC, and DD of the 2X frequency divider to flip-flop internal nodes AA, BB, CC, and DD of the next 1X frequency divider. Control combines the clock signals generated by the 2X frequency divider, the first 1X frequency divider, and the next 1X frequency divider and drives the mixer using the combined clock signals. Control returns to 414.

Referring now to FIG. 8, an example of a method 450 for operating a transmitter is shown. Control begins at 452. At 454, control turns on only the frequency divider having a component size 2X and does not turn on any frequency dividers having a component size 1X, for example. At 456, control turns on and drives only a low-power mixer (e.g., having component size 1X) using clock signals generated by the 2X frequency divider. At 458, control determines if high transmit power is needed. Control ends at 460 if high transmit power is not needed.

At 462, if high transmit power is needed, control turns on and connects a first 1X divider in parallel to the 2X divider, turns on a high-power mixer (e.g., having component size 10X), and turns off the low-power mixer. At 464, control combines the clock signals generated by the 2X frequency divider and the clock signals generated by the first 1X frequency divider, and control drives the high-power mixer using the combined clock signals.

At 466, control determines if additional transmit power is needed. Control ends at 460 if additional transmit power is not needed. At 468, if additional transmit power is needed, control determines if any additional 1X frequency dividers can be used. Control ends at 460 if no additional 1X frequency dividers can be used. At 470, if any additional 1X frequency dividers can be used, control turns on and connects a next 1X divider in parallel to the 2X divider. Control combines the clock signals the clock signals generated by the 2X frequency divider, the first 1X frequency divider, and the next 1X frequency divider and drives the high-power mixer using the combined clock signals. Control returns to 466.

Figure 9A:
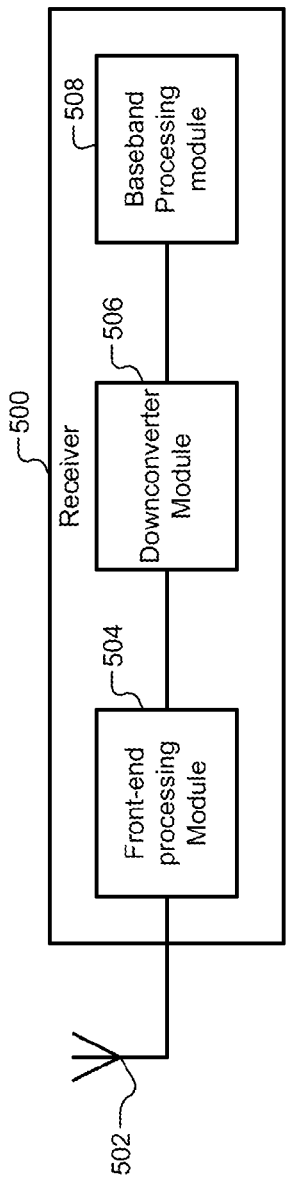
FIG. 9A is a functional block diagram of a receiver.
Figure 9B:
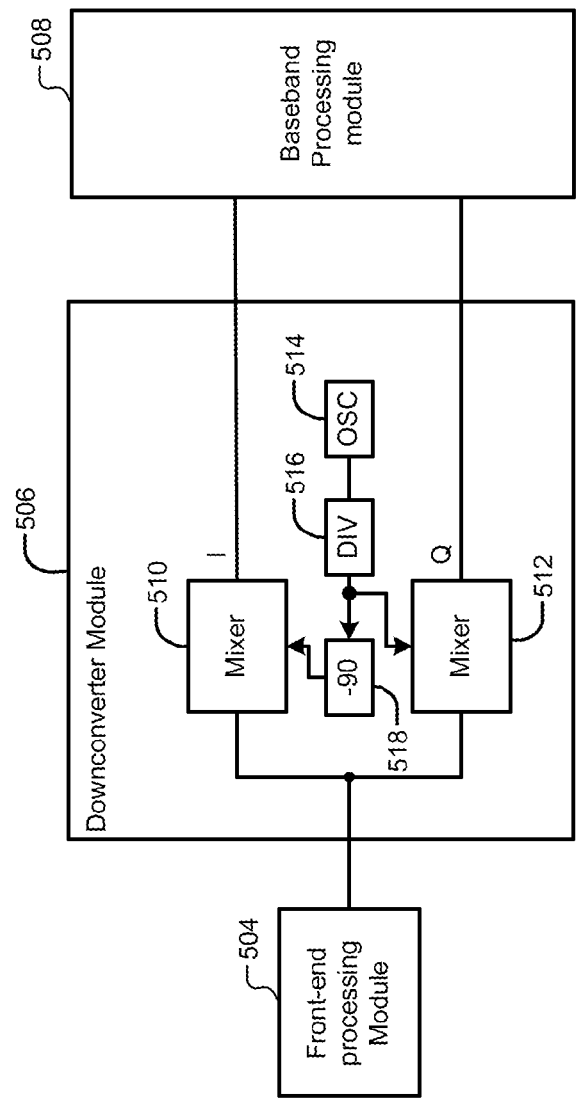
FIG. 9B depicts an example of a receiver.

Referring now to FIGS. 9A and 9B, the teachings of the present disclosure can be applied to frequency dividers used in receivers as well. In FIG. 9A, a receiver 500 includes an antenna 502, a front-end processing module 504, a downconverter module 506, and a baseband processing module 508. While a single antenna is shown, the receiver 500 may include multiple antennas. For example only, the multiple antennas may be arranged in a multiple-input multiple-output (MIMO) configuration. The front-end processing module 504 processes (e.g., amplifies, filters, demodulates, etc.) signals received via the antenna 502. The downconverter module 506 downconverts the signals from radio frequency (RF) to baseband frequency. The baseband processing module 508 performs further processing.

In FIG. 9B, the downconverter module 506 includes down-conversion mixers 510, 512; a local oscillator (OSC) 514; a frequency divider (DIV) 516; and a −90° phase shifter 518. The downconversion mixers 510, 512 downconvert the output of the front-end processing module 504 from RF to baseband frequency and generate I and Q channel baseband signals. The downconversion mixers 510, 512 are driven by clock signals having a predetermined reference frequency. The clock signals are generated by the local oscillator (OSC) 514, the frequency divider (DIV) 516, and the −90° phase shifter 518. The teachings disclosed in reference to FIGS. 2A-8 can be implemented in the downcoverter module 506 of the receiver 500.

The modular frequency dividers disclosed herein can be combined with modular mixer configurations. For example, just as a larger frequency divider (e.g., the main frequency divider 308) achieves better phase noise than a smaller frequency divider (e.g., one of the auxiliary frequency dividers 310), a larger mixer (e.g., the second mixer 306) can yield larger output power in a transmitter and higher linearity in a transmitter and a receiver. The modular frequency dividers can be combined with parallel mixers, which may differ in size, as follows.

In a transmitter (e.g., the transmitter 300), when multiple frequency dividers are used to achieve low phase noise, a large mixer (e.g., the second mixer 306) may be used for high output power and high linearity. As phase noise requirements are reduced as output power is reduced, linearity requirements may also reduce, and a smaller mixer (e.g., the first mixer 304) may be used with a smaller frequency divider (e.g., one of the auxiliary frequency dividers 310) to save current in both the frequency dividers and the mixer at lower output power levels.

For example, in FIG. 3A, when the power requirement of the transmitter 300 decreases, depending on the power requirement of the transmitter 300, the control module 314 disconnects and turns off (i.e., deactivates) one or more of the auxiliary frequency dividers 310 from the main frequency divider 308. For example only, using the switches 312, the control module 314 may sequentially disconnect one or more of the auxiliary frequency dividers 310 from the main frequency divider 308. Additionally, when the power requirement of the transmitter 300 decreases to less than or equal to a predetermined power level, the control module 314 may turn on the first mixer 304 and turn off the second mixer 306 while at least one of the auxiliary frequency dividers 310 is still connected to the main frequency divider 308. The transmitter 300 now operates in the low-power mode.

In a receiver (e.g., the receiver 500), when multiple frequency dividers are used to achieve low phase noise, a larger mixer (e.g., the second mixer 306) may be used for high linearity. As phase noise and linearity requirements are reduced as received power is increased, a smaller mixer (e.g., the first mixer 304) may be used with a smaller frequency divider (e.g., one of the auxiliary frequency dividers 310) to save current in both the frequency dividers and the mixer at higher received power levels.

Figure 10A:
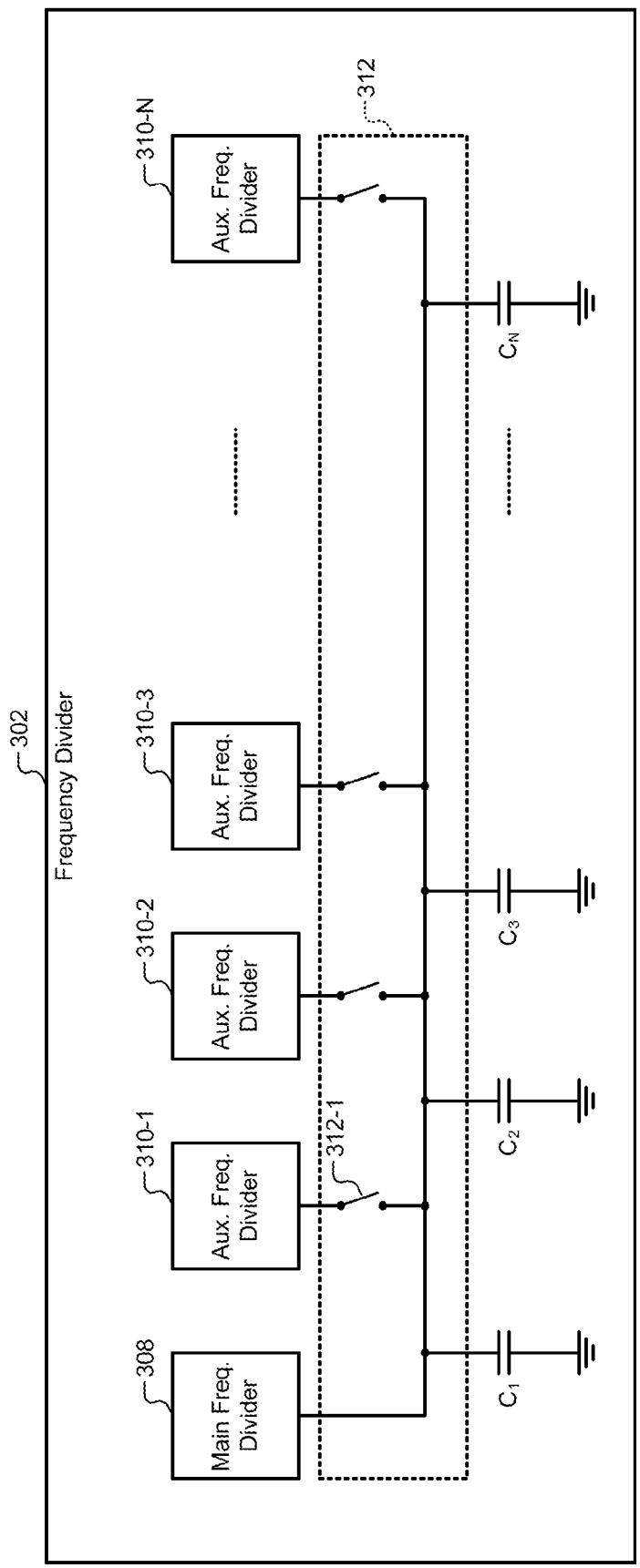
FIG. 10A is a simplified block diagram of the frequency divider of FIG. 3A showing general connections between a main frequency divider and a plurality of auxiliary frequency dividers.
Figure 10B:
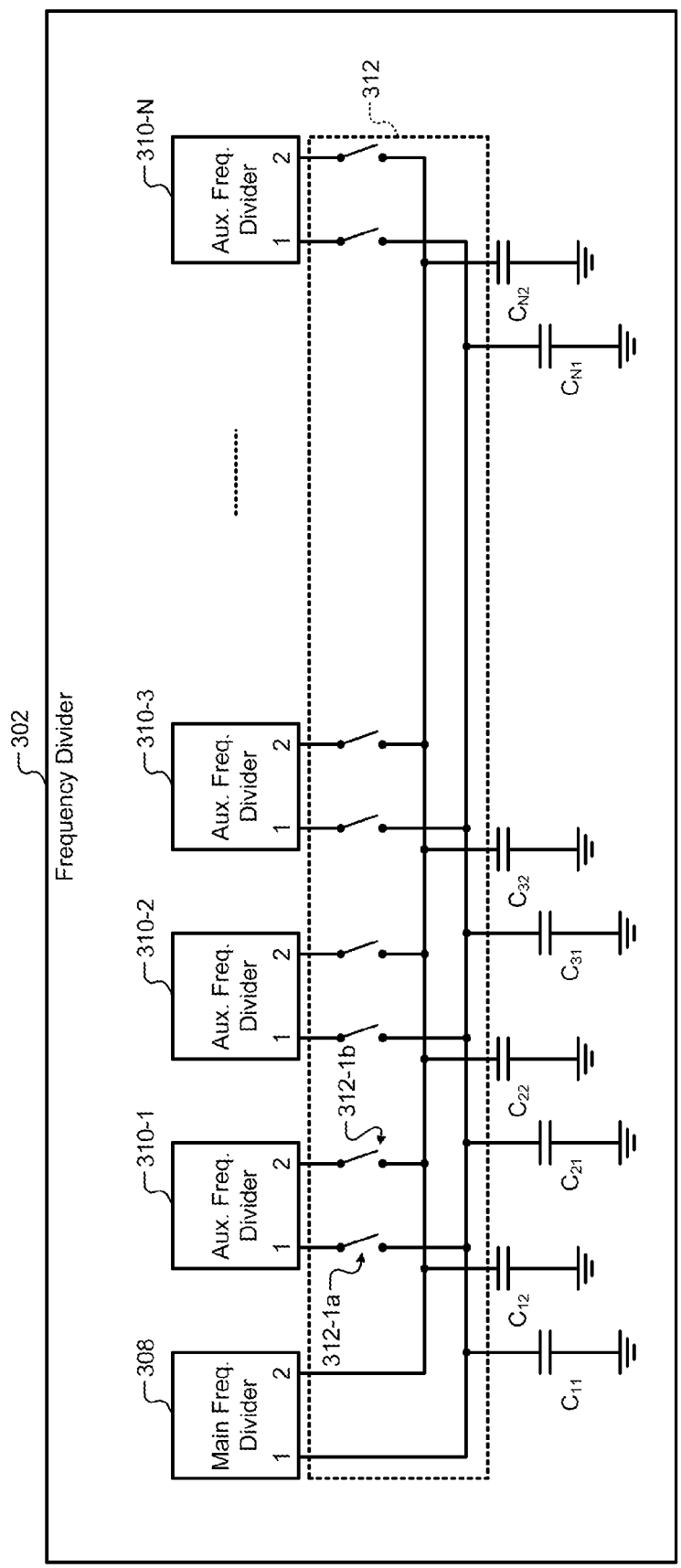
FIG. 10B is a simplified block diagram of the frequency divider of FIG. 3A showing connections between two nodes of the main frequency divider and two nodes of a plurality of auxiliary frequency dividers.

Referring now to FIGS. 10A and 10B, a general representation of the frequency divider 302 (shown in FIGS. 3A and 3B) is shown. The control module 314 is omitted for simplicity of illustration. In FIG. 10A, as explained with reference to FIGS. 3A and 3B, the auxiliary frequency dividers 310 can be sequentially connected in parallel to the main frequency divider 308 using switches 312. The switches 312 connect one or more nodes of each added auxiliary frequency divider 310 to respective nodes of the main frequency divider 308. When the transmitter 300 comprising the frequency divider 302 operates in the low-power mode (e.g., when power to the transmitter 300 is turned on), only the main frequency divider 308 is active. The auxiliary frequency dividers 310 are inactive and are not connected to the main frequency divider 308. As the power requirement of the transmitter 300 increases, one or more of the auxiliary frequency dividers 310 are sequentially connected in parallel to the main frequency divider 308 using the switches 312. In the low-power mode, while none of the auxiliary frequency dividers 310 is connected to the main frequency divider 308, parasitic capacitances $C_1, C_2, C_3, \ldots, C_N$ associated with the switches 312 add up and load the main frequency divider 308.

In FIG. 10B, connections between two nodes—node 1 and node 2—of the main frequency divider 308 and corresponding nodes (nodes 1 and 2) of the auxiliary frequency dividers 310 are shown. For example, node 1 of the main frequency divider 308 may include the flip-flop internal nodes AA, BB, CC, and DD of the first divider 350 of the main frequency divider 308 as shown in FIG. 6. Node 2 of the main frequency divider 308 may include the flip-flop internal nodes AA, BB, CC, and DD of the second divider 352 of the main frequency divider 308 as shown in FIG. 6. Node 1 of each auxiliary frequency divider 310 may include the flip-flop internal nodes AA, BB, CC, and DD of the first divider 380 of the auxiliary frequency divider 310 as shown in FIG. 6. Node 2 of each auxiliary frequency divider 310 may include the flip-flop internal nodes AA, BB, CC, and DD of the second divider 382 of the auxiliary frequency divider 310 as shown in FIG. 6.

In the low-power mode, while none of the auxiliary frequency dividers 310 is connected to the main frequency divider 308, the parasitic capacitances associated with the switches 312 add up and load the main frequency divider 308 at each node of the main frequency divider 308. The total capacitance seen at node 1 of the main frequency divider 308 is a sum of the parasitic capacitances $C_{11}, C_{21}, C_{31}, \ldots, C_{N1}$. The total capacitance seen at node 2 of the main frequency divider 308 is a sum of the parasitic capacitances $C_{12}, C_{22}, C_{32}, \ldots, C_{N2}$.

The parasitic capacitance at each node of the main frequency divider 308 can be reduced. Specifically, the connections of the switches 312 can be configured such that the parasitic capacitance at each node of the main frequency divider 308 is reduced in the low-power mode. More specifically, the connection between the first switch, which connects the first auxiliary frequency divider 310-1 to the main frequency divider 308, and the remaining switches, which connect the remaining auxiliary frequency dividers 310 (i.e., 310-2 through 310-N) to the main frequency divider 308, can be modified. The modified connection presents the main frequency divider 308 with the parasitic capacitance associated with only the first switch when none of the auxiliary frequency dividers 310 is connected to the main frequency divider 308 in the low-power mode.

Figure 11A:
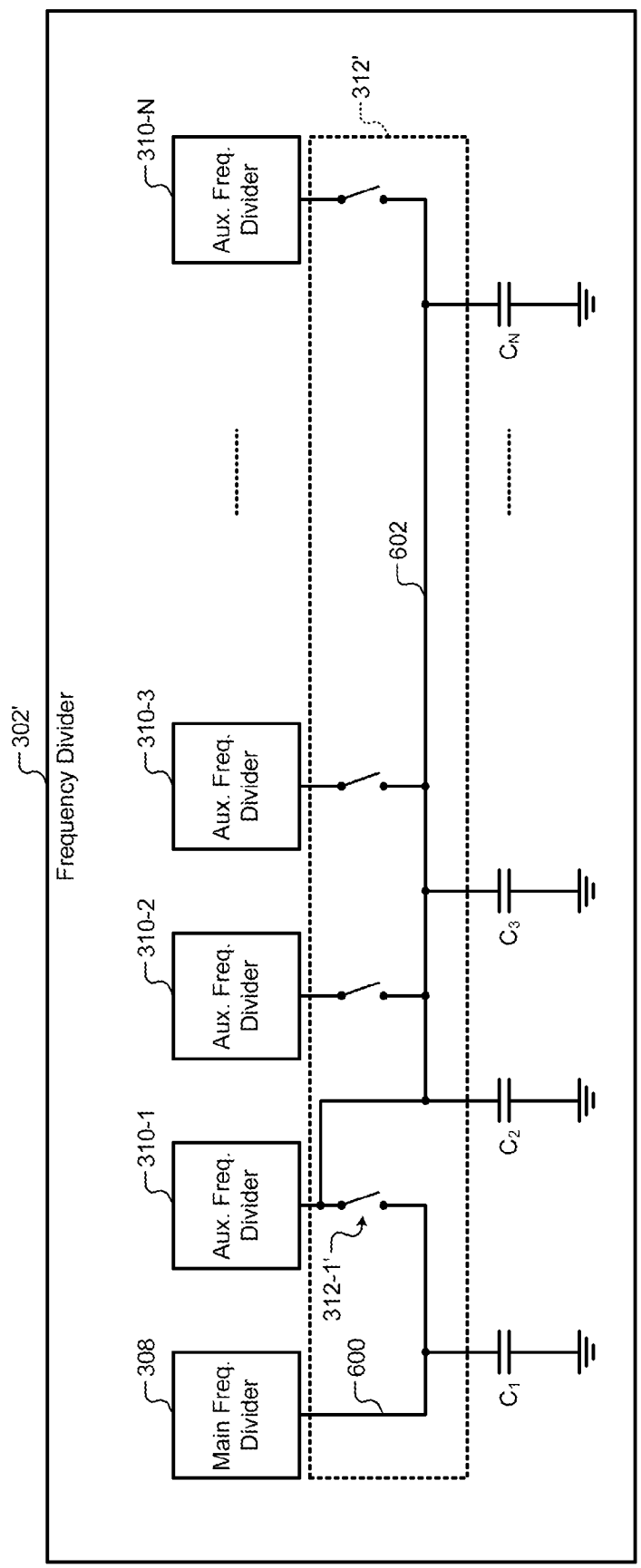
FIG. 11A is a simplified block diagram of the frequency divider of FIG. 3A showing modified connections between a main frequency divider and a plurality of auxiliary frequency dividers.
Figure 11B:
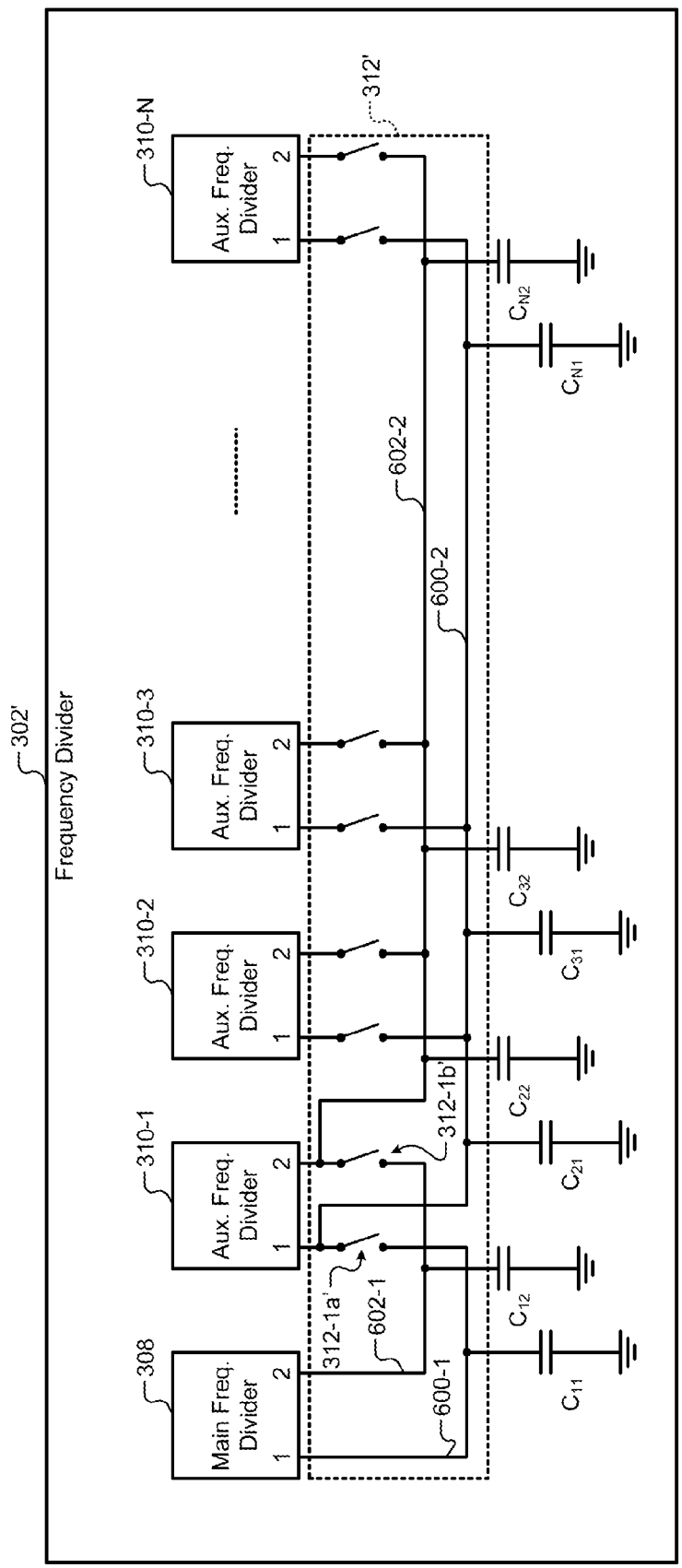
FIG. 11B is a simplified block diagram of the frequency divider of FIG. 3A showing modified connections between two nodes of the main frequency divider and two nodes of a plurality of auxiliary frequency dividers.

Referring now to FIGS. 11A and 11B, the modified connection between the first switch, which connects the first auxiliary frequency divider 310-1 to the main frequency divider 308, and the remaining switches, which connect the remaining auxiliary frequency dividers 310 (i.e., 310-2 through 310-N) to the main frequency divider 308 is shown. In FIG. 11A, the modified connection is shown for only one node. In FIG. 11B, the modified connection is shown for two nodes. In FIGS. 11A and 11B, all of the components, including the control module 314, which is omitted for simplicity of illustration, operate as described with reference to FIGS. 3A-9B. The only difference is the modified connection of the switches 312 as shown in FIGS. 11A and 11B.

In FIG. 11A, switches 312' are used to sequentially connect the auxiliary frequency dividers 310 to the main frequency divider 308. A first conductor 600 has a first end connected to a node of the main frequency divider 308, and a second end. A first switch 312-1' of the switches 312' has a first end connected to the second end of the first conductor 600, and a second end connected to a node of the first auxiliary frequency divider 310-1. In other words, the first end of the first switch 312-1' is connected to the node of the main frequency divider 308, and the second end of the first switch 312-1' is connected to the node of the first auxiliary frequency divider 310-1. A second conductor 602 has a first end connected to the second end of the first switch 312-1', and a second end. The first ends of the remaining switches 312', which are used to connect the remaining auxiliary frequency dividers 310 (i.e., 310-2 through 310-N) to the main frequency divider 308, are connected to the second end of the second conductor 602. The second ends of the remaining switches 312' are respectively connected to the nodes of the remaining auxiliary frequency dividers 310.

In other words, the first ends of the remaining switches 312' are connected to the second end of the first switch 312-1', and the second ends of the remaining switches 312' are respectively connected to the nodes of the remaining auxiliary frequency dividers 310 (i.e., 310-2 through 310-N). In the low-power mode, when none of the auxiliary frequency dividers 310 is connected to the main frequency divider 308, the capacitance seen at the node of the main frequency divider 308 is only C1.

In FIG. 11B, a first conductor 600-1 has a first end connected to the first node (node 1) of the main frequency divider 308, and a second end. A first switch 312-1$a$' of the switches 312' has a first end connected to the second end of the first conductor 600-1, and a second end connected to the first node (node 1) of the first auxiliary frequency divider 310-1. In other words, the first end of the first switch 312-1$a$' is connected to the first node (node 1) of the main frequency divider 308, and the second end of the first switch 312-1$a$' is connected to the first node (node 1) of the first auxiliary frequency divider 310-1.

A second conductor 602-1 has a first end connected to the second end of the first switch 312-1$a$', and a second end. The first ends of the remaining switches 312', which are used to connect the first nodes of the remaining auxiliary frequency dividers 310 (i.e., 310-2 through 310-N) to the first node of the main frequency divider 308, are connected to the second end of the second conductor 602-1. The second ends of the remaining switches 312', which are used to connect the first nodes of the remaining auxiliary frequency dividers 310 to the first node of the main frequency divider 308, are respectively connected to the first nodes (nodes 1) of the remaining auxiliary frequency dividers 310.

In other words, the first ends of the remaining switches 312', which are used to connect the first nodes (nodes 1) of the remaining auxiliary frequency dividers 310 to the first node (node 1) of the main frequency divider 308, are connected to the second end of the first switch 312-1$a$'. The second ends of the remaining switches 312', which are used to connect the first nodes (nodes 1) of the remaining auxiliary frequency dividers 310 to the first node of the main frequency divider 308, are respectively connected to the first nodes (nodes 1) of the remaining auxiliary frequency dividers 310 (i.e., 310-2 through 310-N).

A third conductor 600-2 has a first end connected to the second node (node 2) of the main frequency divider 308, and a second end. A first switch 312-1$b$' of the switches 312' has a first end connected to the second end of the second conductor 600-2, and a second end connected to the second node (node 2) of the first auxiliary frequency divider 310-1. In other words, the first end of the first switch 312-1$b$' is connected to the second node (node 2) of the main frequency divider 308, and the second end of the first switch 312-1$b$' is connected to the second node (node 2) of the first auxiliary frequency divider 310-1.

A fourth conductor 602-2 has a first end connected to the second end of the first switch 312-1$b$', and a second end. The first ends of the remaining switches 312', which are used to connect the second nodes (nodes 2) of the remaining auxiliary frequency dividers 310 (i.e., 310-2 through 310-N) to the second node (node 2) of the main frequency divider 308, are connected to the second end of the fourth conductor 602-2. The second ends of the remaining switches 312', which are used to connect the remaining auxiliary frequency dividers 310 to the main frequency divider 308, are respectively connected to the second nodes (nodes 2) of the remaining auxiliary frequency dividers 310.

In other words, the first ends of the remaining switches 312', which are used to connect the second nodes (nodes 2) of the remaining auxiliary frequency dividers 310 to the second node (node 2) of the main frequency divider 308, are connected to the second end of the first switch 312-1b'. The second ends of the remaining switches 312', which are used to connect the second nodes (nodes 2) of the remaining auxiliary frequency dividers 310 to the second node (node 2) of the main frequency divider 308, are respectively connected to the second nodes (nodes 2) of the remaining auxiliary frequency dividers 310.

In FIG. 11B, in the low-power mode, none of the auxiliary frequency dividers 310 are connected to the main frequency divider 308. In the low-power mode, the capacitances seen at nodes 1 and 2 of the main frequency divider 308 are respectively only C11 and C12.

Figure 12:
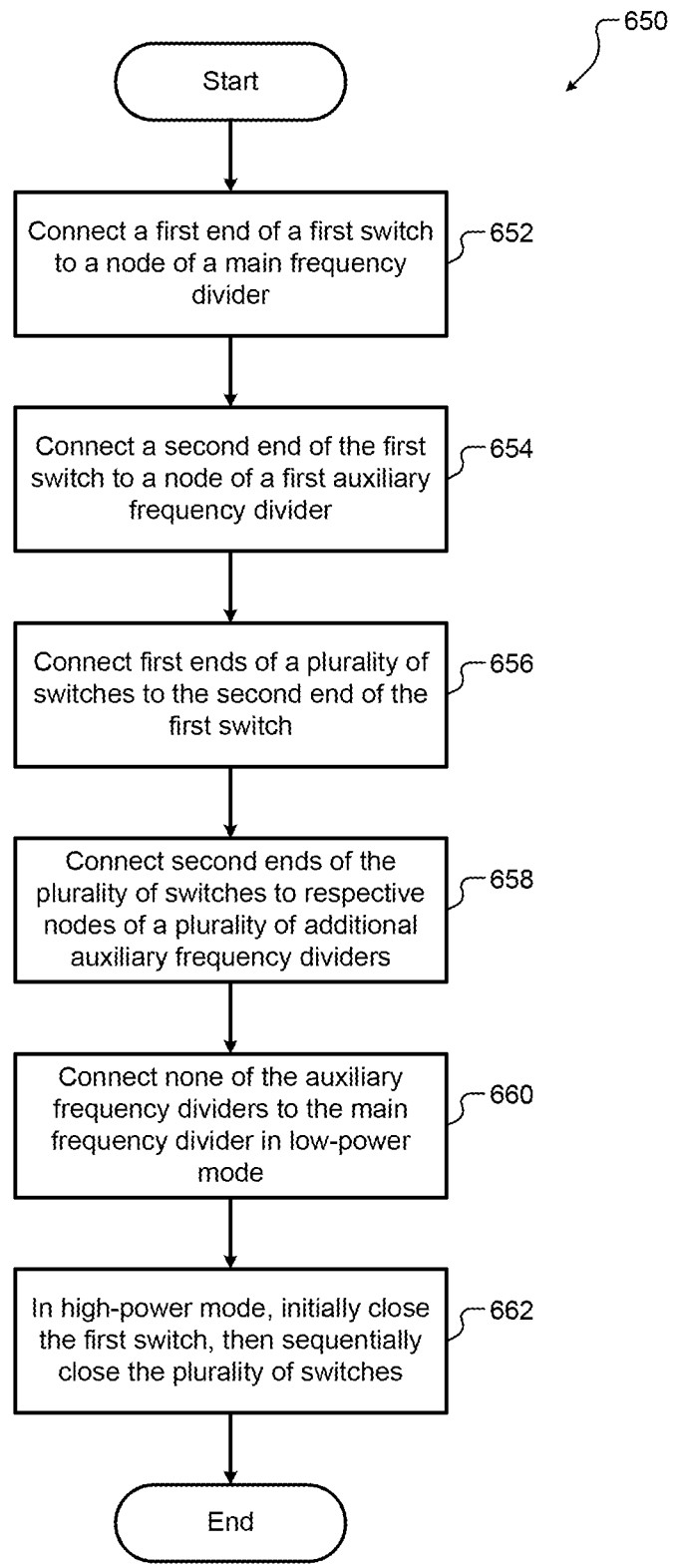
FIG. 12 is a flowchart of a method for connecting the main frequency divider and a plurality of auxiliary frequency dividers to reduce parasitic capacitance at a node of the main frequency divider.

Referring now to FIG. 12, a method 650 for connecting a main frequency divider and a plurality of auxiliary frequency dividers to reduce parasitic capacitance at a node of the main frequency divider is shown. At 652, a first end of a first switch is connected to a node of a main frequency divider. At 654, a second end of the first switch is connected to a node of a first auxiliary frequency divider. At 656, first ends of a plurality of switches are connected to the second end of the first switch. At 658, second ends of the plurality of switches are connected to respective nodes of the plurality of auxiliary frequency dividers. At 660, in low-power mode, none of the auxiliary frequency dividers are connected to the main frequency divider (i.e., the first switch and the plurality of switches are open). At 662, in high-power mode, the first auxiliary frequency divider is initially connected to the main frequency divider by closing the first switch. As additional transmit power is required, one or more of the plurality of auxiliary frequency dividers are subsequently sequentially connected to the main frequency divider by sequentially closing one or more of the plurality switches. In the low-power mode, when none of the auxiliary frequency dividers are connected to the main frequency divider (i.e., when the first switch and the plurality of switches are open), the parasitic capacitance at the node of the main frequency divider is reduced.

The foregoing description is merely illustrative in nature and is in no way intended to limit the disclosure, its application, or uses. The broad teachings of the disclosure can be implemented in a variety of forms. Therefore, while this disclosure includes particular examples, the true scope of the disclosure should not be so limited since other modifications will become apparent upon a study of the drawings, the specification, and the following claims. For purposes of clarity, the same reference numbers will be used in the drawings to identify similar elements. As used herein, the phrase at least one of A, B, and C should be construed to mean a logical (A or B or C), using a non-exclusive logical OR. It should be understood that steps within a method may be executed in different order without altering the principles of the present disclosure.

As used herein, the term module may refer to, be part of, or include an Application Specific Integrated Circuit (ASIC); an electronic circuit; a combinational logic circuit; a field programmable gate array (FPGA); a processor (shared, dedicated, or group) that executes code; other suitable components that provide the described functionality; or a combination of some or all of the above, such as in a system-on-chip. The term module may include memory (shared, dedicated, or group) that stores code executed by the processor.

The term code, as used above, may include software, firmware, and/or microcode, and may refer to programs, routines, functions, classes, and/or objects. The term shared, as used above, means that some or all code from multiple modules may be executed using a single (shared) processor. In addition, some or all code from multiple modules may be stored by a single (shared) memory. The term group, as used above, means that some or all code from a single module may be executed using a group of processors. In addition, some or all code from a single module may be stored using a group of memories.

The apparatuses and methods described herein may be implemented by one or more computer programs executed by one or more processors. The computer programs include processor-executable instructions that are stored on a non-transitory tangible computer readable medium. The computer programs may also include stored data. Non-limiting examples of the non-transitory tangible computer readable medium are nonvolatile memory, magnetic storage, and optical storage.

What is claimed is:

1. A system comprising:
   a first frequency divider configured to divide an input frequency of an input signal to generate a first signal having a first frequency and a first phase;
   a plurality of second frequency dividers each configured to divide the input frequency of the input signal to generate a second signal having the first frequency and a second phase;
   a first switch including a first end connected to a first node of the first frequency divider, and a second end connected to a second node of a first one of the plurality of second frequency dividers; and
   a plurality of second switches including first ends connected to the second end of the first switch, and second ends respectively connected to the second nodes of the plurality of second frequency dividers other than the first one of the plurality of second frequency dividers,
   wherein in response to the first switch being open, a capacitance at the first node of the first frequency divider is a capacitance associated with the first switch.

2. The system of claim 1, wherein:
   the first frequency divider includes a first plurality of components connected to the first node; and
   each of the second frequency dividers includes a second plurality of components connected to the second node.

3. The system of claim 2, wherein:
   the first plurality of components of the first frequency divider has a first area; and
   the second plurality of components of each of the second frequency dividers has a second area that is less than the first area.

4. The system of claim 2, further comprising a control module configured to sequentially connect the plurality of second frequency dividers in parallel to the first frequency divider by initially closing the first switch and subsequently closing one or more of the plurality of second switches.

5. The system of claim 4, wherein in response to the control module connecting the plurality of second frequency dividers to the first frequency divider, the second phase of the second signal generated by the plurality of second frequency dividers matches the first phase of the first signal generated by the first frequency divider.

6. The system of claim 4, wherein the first frequency divider includes a third plurality of components connected to a third node, and each of the plurality of second frequency dividers includes a fourth plurality of components connected to a fourth node, the system further comprising:
 a third switch including a first end connected to the third node, and a second end connected to the fourth node of the first one of the plurality of second frequency dividers; and
 a plurality of fourth switches including first ends connected to the second end of the third switch, and second ends respectively connected to the fourth nodes of the plurality of second frequency dividers other than the first one of the plurality of second frequency dividers.

7. The system of claim 6, wherein the control module is configured to initially close the third switch with the first switch and close one or more of the plurality of the fourth switches respectively with the plurality of second switches.

8. The system of claim 6, wherein:
 the first and third plurality of components of the first frequency divider has a first area; and
 the fourth plurality of components of each of the second frequency dividers has a second area that is less than the first area.

9. The system of claim 7, wherein:
 in response to the control module not closing the first switch and the plurality of the second switches, a capacitance at the first node includes a parasitic capacitance of only the first switch; and
 in response to the control module not closing the third switch and the plurality of the fourth switches, a capacitance at the third node includes a parasitic capacitance of only the third switch.

10. The system of claim 2, further comprising a mixer configured to upconvert a transmit signal using a clock signal, wherein the clock signal includes the first signal generated by the first frequency divider and the second signal generated by the one of the second frequency dividers.

11. The system of claim 10, wherein each of the first and second frequency dividers is further configured to:
 divide the input signal by a first factor when the transmit signal is transmitted in a first frequency band; and
 divide the input signal by a second factor when the transmit signal is transmitted in a second frequency band,
 wherein the second factor is different than the first factor, and
 wherein the second band is different than the first band.

12. The system of claim 4, further comprising:
 a first mixer configured to upconvert a transmit signal using a first clock signal, wherein the first clock signal includes the first signal generated by the first frequency divider; and
 a second mixer configured to upconvert the transmit signal using a second clock signal, wherein the second clock signal includes the first signal generated by the first frequency divider and the second signal generated by each of the plurality of second frequency dividers connected to the first frequency divider,
 wherein the control module is configured to
  activate only the first mixer when the transmit signal is transmitted at a first power level, and
  deactivate the first mixer and activate the second mixer when the transmit signal is transmitted at a second power level that is greater than the first power level.

13. The system of claim 12, wherein:
 the first mixer includes components having a first area; and
 the second mixer includes components having a second area that is greater than the first area.

14. The system of claim 12, wherein a number of the second frequency dividers connected in parallel to the first frequency divider depends on the first and second power levels.

15. A method comprising:
 generating a first signal having a first frequency and a first phase by dividing an input frequency of an input signal using a first frequency divider;
 generating a second signal having the first frequency and a second phase by dividing the input frequency of the input signal using a plurality of second frequency dividers;
 connecting a first end of a first switch to a first node of the first frequency divider;
 connecting a second end of the first switch to a second node of a first one of the plurality of second frequency dividers;
 connecting first ends of a plurality of second switches to the second end of the first switch; and
 connecting second ends of the plurality of second switches respectively to the second nodes of the plurality of second frequency dividers other than the first one of the plurality of second frequency dividers,
 wherein in response to the first switch being open, a capacitance at the first node of the first frequency divider is a capacitance associated with the first switch.

16. The method of claim 15, further comprising sequentially connecting the plurality of second frequency dividers in parallel to the first frequency divider by initially closing the first switch and subsequently closing one or more of the plurality of second switches.

17. The method of claim 15, wherein in response to connecting the plurality of second frequency dividers to the first frequency divider, the second phase of the second signal generated by the plurality of second frequency dividers matches the first phase of the first signal generated by the first frequency divider.

18. The method of claim 15, wherein in response to not closing the first switch and the plurality of the second switches, a capacitance at the first node includes a parasitic capacitance of only the first switch.

19. The method of claim 15, further comprising upconverting a transmit signal using a clock signal, wherein the clock signal includes the first signal generated by the first frequency divider and the second signal generated by the one of the second frequency dividers.

20. The method of claim 19, further comprising:
 dividing the input signal by a first factor when the transmit signal is transmitted in a first frequency band; and
 dividing the input signal by a second factor when the transmit signal is transmitted in a second frequency band,
 wherein the second factor is different than the first factor, and
 wherein the second band is different than the first band.

* * * * *